US009899187B2

(12) United States Patent
Kato et al.

(10) Patent No.: US 9,899,187 B2
(45) Date of Patent: Feb. 20, 2018

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventors: Yasuo Kato, Yokohama (JP); Masafumi Ise, Yokosuka (JP); Ryoh Kawana, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 122 days.

(21) Appl. No.: 15/082,063

(22) Filed: Mar. 28, 2016

(65) Prior Publication Data

US 2016/0314933 A1 Oct. 27, 2016

(30) Foreign Application Priority Data

Apr. 21, 2015 (JP) ................................ 2015-087042

(51) Int. Cl.
*H01J 37/302* (2006.01)

(52) U.S. Cl.
CPC .. *H01J 37/3026* (2013.01); *H01J 2237/30455* (2013.01); *H01J 2237/31769* (2013.01); *H01J 2237/31796* (2013.01)

(58) Field of Classification Search
CPC ........ B82Y 10/00; B82Y 40/00; H01J 37/304; H01J 37/3023; H01J 37/3045; H01J 37/3026; H01J 37/3174; H01J 2237/30461; H01J 2237/30483; H01J 2237/31764; H01J 2237/31769; H01J 2237/31776

See application file for complete search history.

(56) References Cited

U.S. PATENT DOCUMENTS 8,207,514 B2  6/2012  Hara et al.
8,563,953 B2  10/2013  Nakayamada et al.
(Continued)

FOREIGN PATENT DOCUMENTS

JP  2012-54361  3/2012
JP  2012-69675  4/2012
(Continued)

OTHER PUBLICATIONS

Office Action dated May 29, 2017 in Korean Patent Application No. 10-2016-0048667 (with English translation).

*Primary Examiner* — David E Smith
*Assistant Examiner* — Hsien Tsai
(74) *Attorney, Agent, or Firm* — Oblon, McClelland, Maier & Neustadt, L.L.P.

(57) ABSTRACT

A charged particle beam writing apparatus includes a processing circuitry configured to calculate a third proximity effect correction irradiation coefficient where at least one correction irradiation coefficient term up to k-th order term, in correction irradiation coefficient terms of from a first order term to a n-th order term for a first proximity effect correction irradiation coefficient which does not take account of a predetermined effect, are replaced by at least one correction irradiation coefficient term up to the k-th order term, for a second proximity effect correction irradiation coefficient which takes account of the predetermined effect; and a processing circuitry configured to calculate a dose by using the third proximity effect correction irradiation coefficient.

10 Claims, 12 Drawing Sheets

(56) References Cited

U.S. PATENT DOCUMENTS

| | | |
|---|---|---|
| 9,224,578 B2 | 12/2015 | Nakayamada et al. |
| 2009/0008568 A1 | 1/2009 | Abe |
| 2011/0068281 A1 | 3/2011 | Hara et al. |
| 2012/0068089 A1 | 3/2012 | Nakayamada et al. |
| 2013/0099139 A1* | 4/2013 | Kato .................. H01J 37/3174 |
| | | 250/492.3 |
| 2014/0291553 A1 | 10/2014 | Nakayamada et al. |
| 2015/0041684 A1* | 2/2015 | Kato .................. H01J 37/3026 |
| | | 250/492.22 |

FOREIGN PATENT DOCUMENTS

| | | |
|---|---|---|
| JP | 5530688 | 6/2014 |
| JP | 2014-209599 | 11/2014 |
| KR | 10-2009-0004730 | 1/2009 |

\* cited by examiner

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2015-087042 filed on Apr. 21, 2015 in Japan, the entire contents of which are incorporated herein by reference.

BACKGROUND OF THE INVENTION

Field of the Invention

Embodiments of the present invention relate generally to a charged particle beam writing apparatus and a charged particle beam writing method, and more specifically, relate to a writing apparatus and method that perform proximity effect correction in the case, for example, where a dose is modulated (or adjusted) due to a prescribed effect other than the proximity effect.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

For example, a writing apparatus using a single beam is known, and further, there can be cited a writing apparatus employing the raster method. In the writing apparatus employing the raster method, for example, an electron beam emitted from the electron gun passes through a mask with one hole to be shaped, and the shaped beam is deflected by a deflector to move in a tracing manner on the target object or "sample" in order to irradiate a necessary point by blanking control.

Further, for example, a writing apparatus using multiple beams is known. When compared to the case of writing or "drawing" a pattern with a single electron beam, since it is possible to irradiate many beams at a time in multi-beam writing, the throughput can be greatly increased. For example, in the writing apparatus employing the multi-beam system, multi-beams are formed by letting portions of an electron beam emitted from an electron gun pass through a corresponding hole of a plurality of holes in the mask, and each beam is blanking-controlled such that each unblocked beam is reduced by an optical system and deflected by a deflector so as to irradiate a desired position on the target object.

Moreover, besides the writing apparatus employing the raster method described above, as the writing apparatus using a single beam, there can be cited, for example, a variable-shaped beam (VSB) writing apparatus. In the writing apparatus of the VSB system, while forming a shot beam by a blanking control, the relative position of two-stage shaping apertures through which the beam passes is variably controlled, thereby variably shaping a beam of each shot. Then, the variably shaped beam is deflected by a deflector so as to irradiate a desired position on the target object.

In the various writing systems described above, there is a problem with respect to writing by the raster method or writing method with the multi-beam system in that, when a pattern edge or corner is written, if the pattern edge (boundary) is deviated from the pixel boundary, a desired shape of the pattern edge or corner cannot be formed with a design irradiation dose thereon. Accordingly, it has been examined to perform correction by adjusting the dose thereto.

With recent development of the optical lithography technology and shorter wavelengths due to EUV (extreme ultraviolet), the number of electron beam shots required for mask writing is increasing acceleratingly. On the other hand, for ensuring the line width accuracy needed for micropatterning, it is aimed to diminish shot noise and pattern edge roughness by making resist less sensitive and increasing the dose. Thus, since the number of shots and the amount of dose increase limitlessly, the pattern writing time also increases limitlessly. Therefore, in the writing apparatuses of various writing systems described above, it is now examined to reduce the writing time by increasing the current density.

However, if the target is irradiated with an increased amount of energy as a higher density electron beam in a short time, another problem occurs in that the substrate overheats resulting in a phenomenon called "resist heating" of changing the resist sensitivity and degrading the line width accuracy. To solve this problem, it is suggested to calculate, for each minimum deflection region in the deflection region, a representative temperature of the minimum deflection region concerned based on heat transfer from other minimum deflection regions written prior to the current one, and to modulate the dose by using the representative temperature (refer to Japanese Patent Application Laid-open (JP-A) No. 2012-069675).

On the other hand, in the electron beam writing, a phenomenon called a "proximity effect" occurs when electron beams irradiate a mask covered with resist to write a circuit pattern thereon. The proximity effect occurs by backscattering of electron beams penetrating the resist film, reaching the layer thereunder to be reflected, and entering the resist film again. As a result, a dimensional variation occurs, that is, a written pattern is deviated from a desired dimension. In order to avoid this phenomenon, a proximity effect correction operation that suppresses such dimensional variation by, for example, modulating the dose is performed in the writing apparatus.

However, even when the dose is adjusted by performing proximity effect correction calculation, if subsequently performing dose modulation for correcting various effects other than the proximity effect, such as pattern edge/corner correction, resist heating correction described above, etc., there arises another problem in that correction residual error occurs regarding proximity effect correction.

As described above, since correction residual error arises in proximity effect correction, it is necessary to again perform proximity effect correction calculation after dose modulation calculation for correcting various effects. However, even in such a case, there is still a problem in that since the calculation amount of proximity effect correction is large, rather sufficient computer resource and processing time are needed, thereby resulting in a problem of difficulty of real time correction calculation. Accordingly, it is necessary to efficiently perform the processing.

BRIEF SUMMARY OF THE INVENTION

According to one aspect of the present invention, a charged particle beam writing apparatus includes a first correction-irradiation-coefficient-term calculation processing circuitry configured to calculate correction irradiation coefficient terms of from a first order term to an n-th order term, n being an integer of 1 or more, in a case of calculating a first proximity effect correction irradiation coefficient which does not take account of a predetermined effect in order to correct proximity effect of a charged particle beam; a second correction-irradiation-coefficient-term calculation processing circuitry configured to calculate at least one correction irradiation coefficient term up to a k-th order term, k being an integer from 1 to n, in a case of calculating a second proximity effect correction irradiation coefficient which takes account of the predetermined effect in order to correct the proximity effect of the charged particle beam; a proximity-effect-correction-irradiation-coefficient calculation processing circuitry configured to calculate a third proximity effect correction irradiation coefficient where at least one correction irradiation coefficient term up to the k-th order term, in the correction irradiation coefficient terms of from the first order term to the n-th order term for the first proximity effect correction irradiation coefficient which does not take account of the predetermined effect, are replaced by the at least one correction irradiation coefficient term up to the k-th order term, for the second proximity effect correction irradiation coefficient which takes account of the predetermined effect; a dose calculation processing circuitry configured to calculate a dose by using the third proximity effect correction irradiation coefficient; and a writing mechanism including a stage on which a target object is placed, a charged particle beam source, and a deflector, the writing mechanism configured to write a pattern on the target object by using a charged particle beam based on the dose calculated.

According to another aspect of the present invention, a charged particle beam writing method includes calculating sequentially correction irradiation coefficient terms of from a first order term to an n-th order term, n being an integer of 1 or more, in a case of calculating a first proximity effect correction irradiation coefficient which does not take account of a predetermined effect in order to correct proximity effect of a charged particle beam; calculating at least one correction irradiation coefficient term up to a k-th order term, k being an integer from 1 to n, in a case of calculating a second proximity effect correction irradiation coefficient which takes account of the predetermined effect in order to correct the proximity effect of the charged particle beam; calculating a third proximity effect correction irradiation coefficient where at least one correction irradiation coefficient term up to the k-th order term, in the correction irradiation coefficient terms of from the first order term to the n-th order term for the first proximity effect correction irradiation coefficient which does not take account of the predetermined effect, are replaced by the at least one correction irradiation coefficient term up to the k-th order term, for the second proximity effect correction irradiation coefficient which takes account of the predetermined effect; calculating a dose by using the third proximity effect correction irradiation coefficient; and writing a pattern on a target object by using a charged particle beam based on the dose calculated.

DETAILED DESCRIPTION OF THE INVENTION

In the embodiments below, there will be described an apparatus and method that can perform writing with efficiently suppressing pattern dimensional variation due to various effects while suppressing correction residual error of proximity effect.

In the embodiments below, there will be described a configuration in which an electron beam is used as an example of a charged particle beam. The charged particle beam is not limited to the electron beam, and other charged particle beams such as an ion beam may also be used.

First Embodiment

Figure 1:
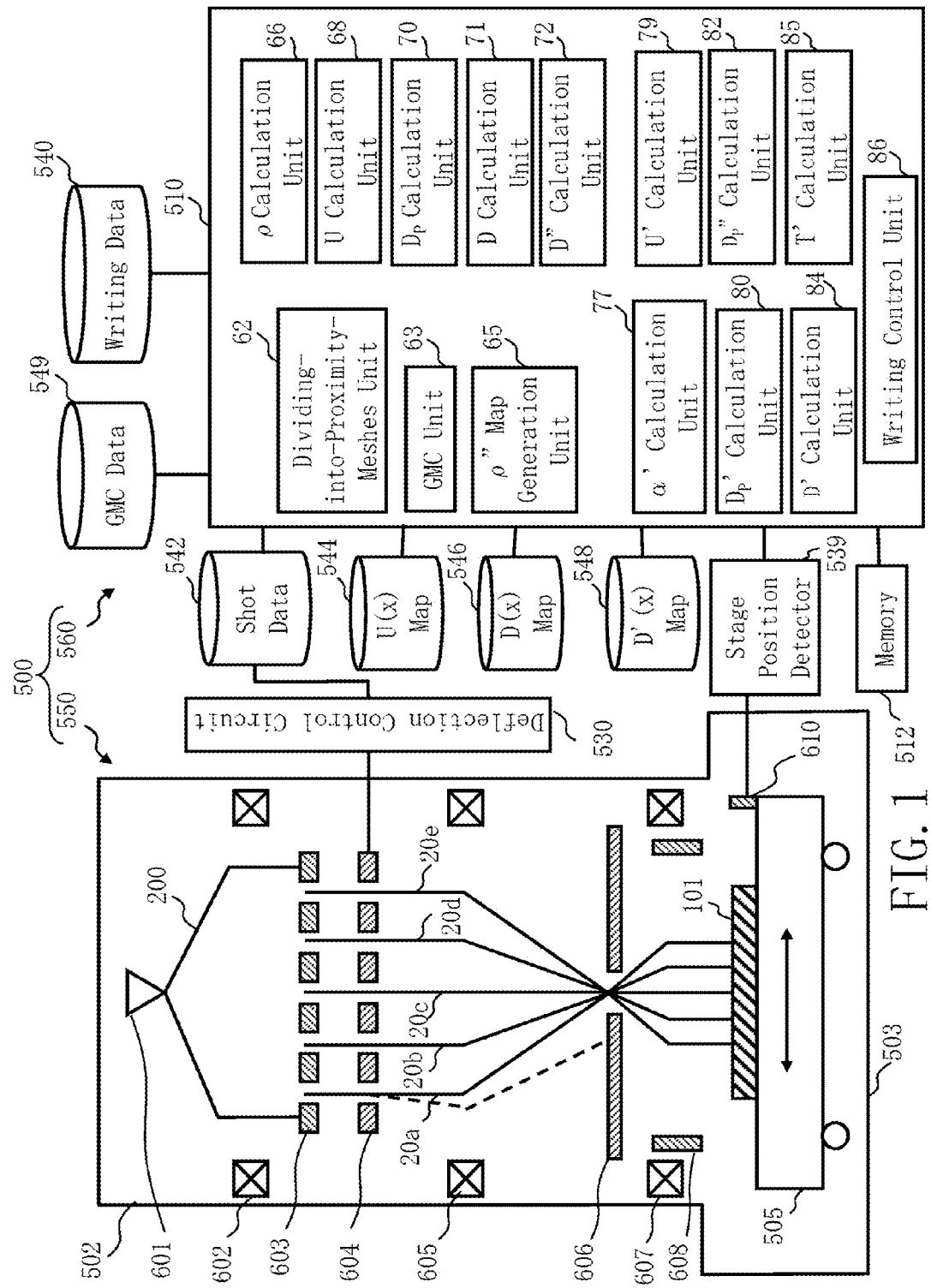
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 500 includes a writing mechanism 550 and a control unit 560. The writing apparatus 500 is an example of a multi charged particle beam writing apparatus. The writing mechanism 550 includes an electron optical column 502 and a writing chamber 503. In the electron optical column 502, there are arranged an electron gun 601, an illumination lens 602, a multi-beam forming member 603, a blanking plate 604, a reducing lens 605, a limiting aperture member 606, an objective lens 607, and a deflector 608. In the writing chamber 503, an XY stage 505 is arranged. On the XY stage 505, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. A mirror 610 for measuring the position of the XY stage 505 is arranged on the XY stage 505.

The control unit 560 includes a control computer 510, a memory 512, a deflection control circuit 530, a stage position detector 539, and storage devices 540, 542, 544, 546, 548, and 549 such as magnetic disk drives. The control computer 510, the memory 512, the deflection control circuit 530, the stage position detector 539, and the storage devices 540, 542, 544, 546, 548, and 549 are connected with each other through a bus (not shown). Writing data that defines pattern data of a plurality of figure patterns to be written is input from outside the writing apparatus 500 and stored in the storage device 540 (storage unit). GMC (grid matching correction) data is input from outside the writing apparatus 500 and stored in the storage device 549 (storage unit).

In the control computer 510, there are arranged a dividing-into-proximity-meshes unit 62, a grid matching correction (GMC) unit 63, an area density ($\rho''$) map generation unit 65, an area density ($\rho$) calculation unit 66, a proximity effect density (U) calculation unit 68, an irradiation correction coefficient ($D_p$) calculation unit 70, a dose (D) calculation unit 71, a D" calculation unit 72, an influence coefficient ($\alpha'$) calculation unit 77, a U' calculation unit 79, an irradiation correction coefficient ($D_p'$) calculation unit 80, an irradiation correction coefficient ($D_p''$) calculation unit 82, a dose (D') calculation unit 84, an irradiation time (t') calculation unit 85, and a writing control unit 86. Each of the "units" such as the dividing-into-proximity-meshes unit 62, the GMC unit 63, the area density ($\rho''$) map generation unit 65, the area density ($\rho$) calculation unit 66, the proximity effect density (U) calculation unit 68, the irradiation correction coefficient ($D_p$) calculation unit 70, the dose (D) calculation unit 71, the D" calculation unit 72, the influence coefficient ($\alpha'$) calculation unit 77, the U' calculation unit 79, the irradiation correction coefficient ($D_p'$) calculation unit 80, the irradiation correction coefficient ($D_p''$) calculation unit 82, the dose (D') calculation unit 84, the irradiation time (t') calculation unit 85, and the writing control unit 86 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Input data required in the control computer unit 110, and calculated results are stored in the memory 512 each time.

FIG. 1 shows a configuration necessary for explaining the first embodiment. Other configuration elements generally necessary for the writing apparatus 500 may also be included.

Figure 2A:
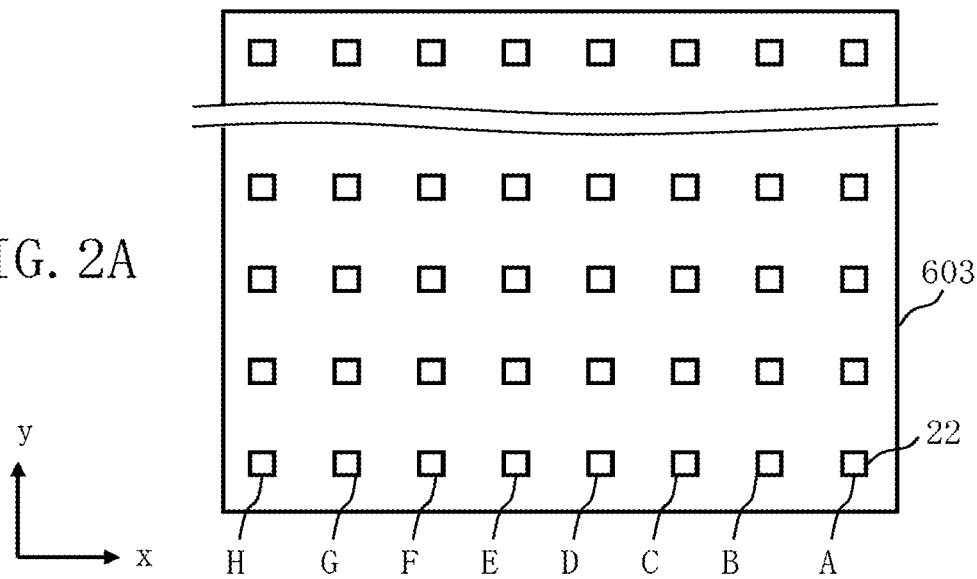
FIGS. 2A and 2B are conceptual diagrams each showing a configuration of a multi-beam forming member according to the first embodiment.
Figure 2B:
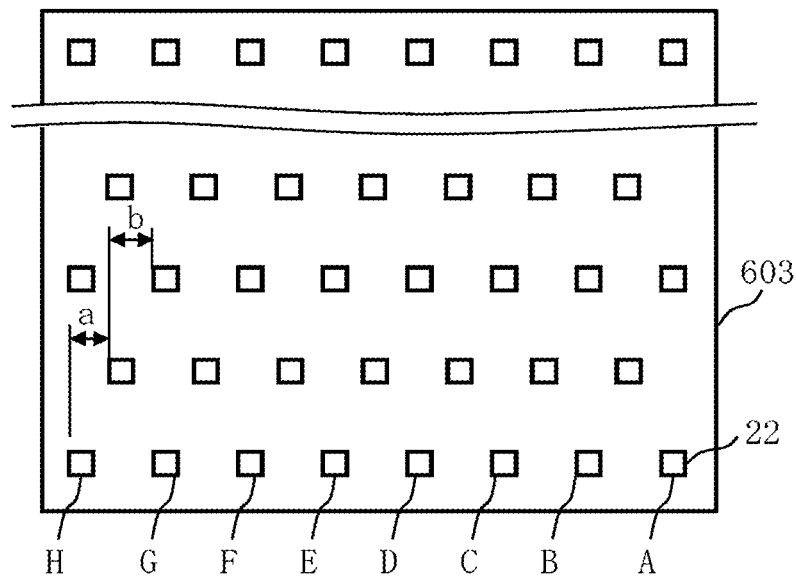

FIGS. 2A and 2B are conceptual diagrams each showing a configuration of a multi-beam forming member according to the first embodiment. As shown in FIG. 2A, holes (openings) 22 of m rows long (y direction) and n columns wide (x direction) (m≥2, n≥2) are formed, like a matrix, at a predetermined arrangement pitch in the multi-beam forming member 603. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 600 individually pass through a corresponding hole of a plurality of holes 22. The case in which the holes 22 of a plurality of rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
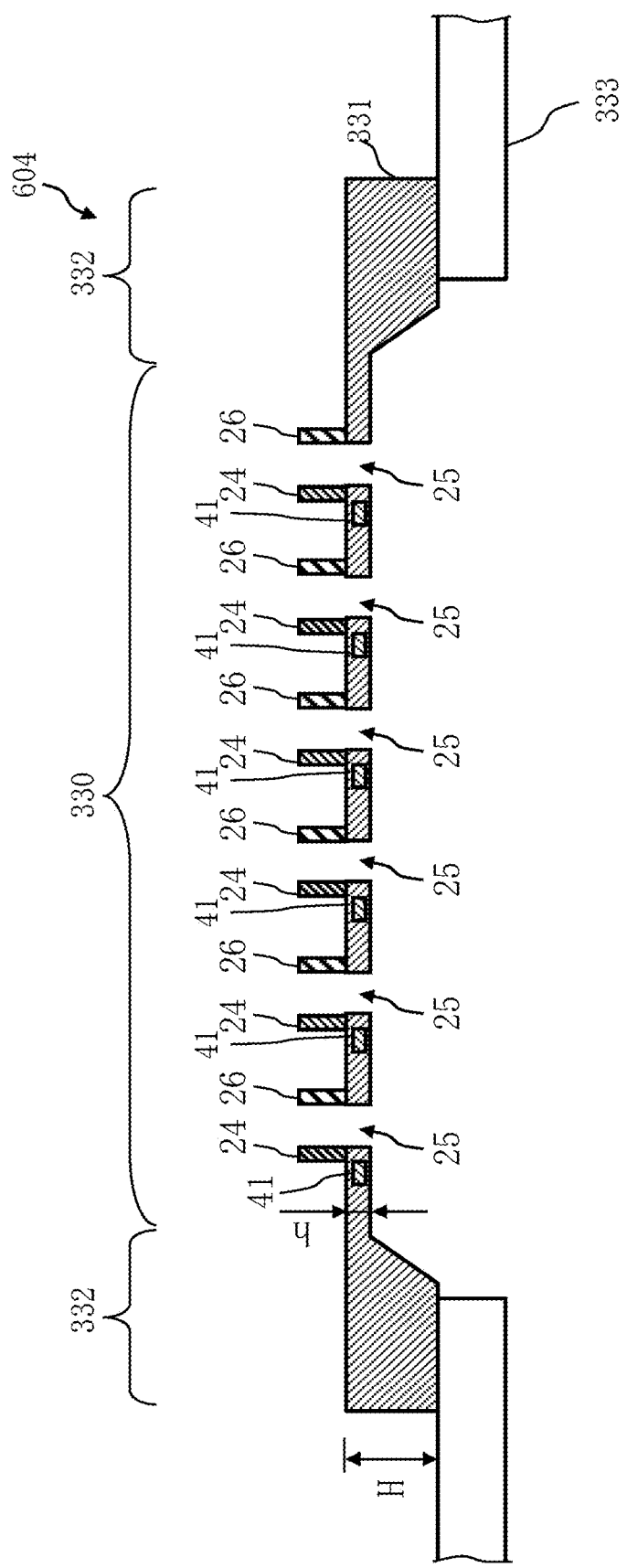
FIG. 3 is a sectional view showing a configuration of a blanking plate according to the first embodiment.

FIG. 3 is a sectional view showing the configuration of a blanking plate according to the first embodiment. In FIG. 3, the positional relations between electrodes 24 and 26, and a control circuit 41 are not in accordance with each other. With regard to the configuration of the blanking plate 604 (blanking device), as shown in FIG. 3, a semiconductor substrate 331 made of silicon, etc. is placed on a support table 333. The central part of the substrate 331 is shaved from the back side and processed to be a membrane region 330 (first region) having a thin film thickness h. The circumference surrounding the membrane region 330 is a circumference region 332 (second region) having a thick film thickness H. The upper surface of the membrane region 330 and the upper surface of the circumference region 332 are formed to be at the same height position, or substantially at the same height position. At the backside of the circumference region 332, the substrate 331 is supported to be on the support table 333. The central part of the support table 333 is open, and the position of the membrane region 330 is located in the opening part of the support table 333.

In the membrane region 330, there are formed passage holes 25 (openings), through each of which a corresponding one of multi-beams passes, at the positions each corresponding to each hole 22 of the multi-beam forming member 603 shown in FIGS. 2A and 2B. In other words, in the substrate 331, a plurality of penetrating passage holes 25 through each of which a corresponding electron beam 20 of multi-beams passes are formed in a two-dimensional array of m rows long (y direction) and n columns wide (x direction) (m≥2, n≥2). A plurality of pairs of electrodes 24 and 26 (blanker: blanking deflector) at opposite sides of a corresponding one of a plurality of passage holes 25 are arranged in the membrane region 330 as shown in FIG. 3. Moreover, close to each passage hole 25, in the substrate 331 of the membrane region 330, there is arranged a control circuit 41 (logic circuit) which applies a deflection voltage to the electrode 24 for each passage hole 25. The other one (for example, electrode 26) of the two electrodes 24 and 26 for each beam is grounded (earthed). Further, as shown in FIG. 3, for example, 10-bit parallel lines for control signals are connected to each control circuit 41. In addition to the 10-bit parallel lines, for example, lines for power supply, control clock, etc. are connected to each control circuit 41. A part of the parallel lines may be used as the line for power supply. An individual blanking mechanism 47 composed of the electrodes 24 and 26 and the control circuit 41 is configured for each of multi-beams. Moreover, on the circumference region 332 having a thick film thickness, pads etc. (not shown) each of which transmits a control signal to each control circuit 41 are arranged.

Figure 4:
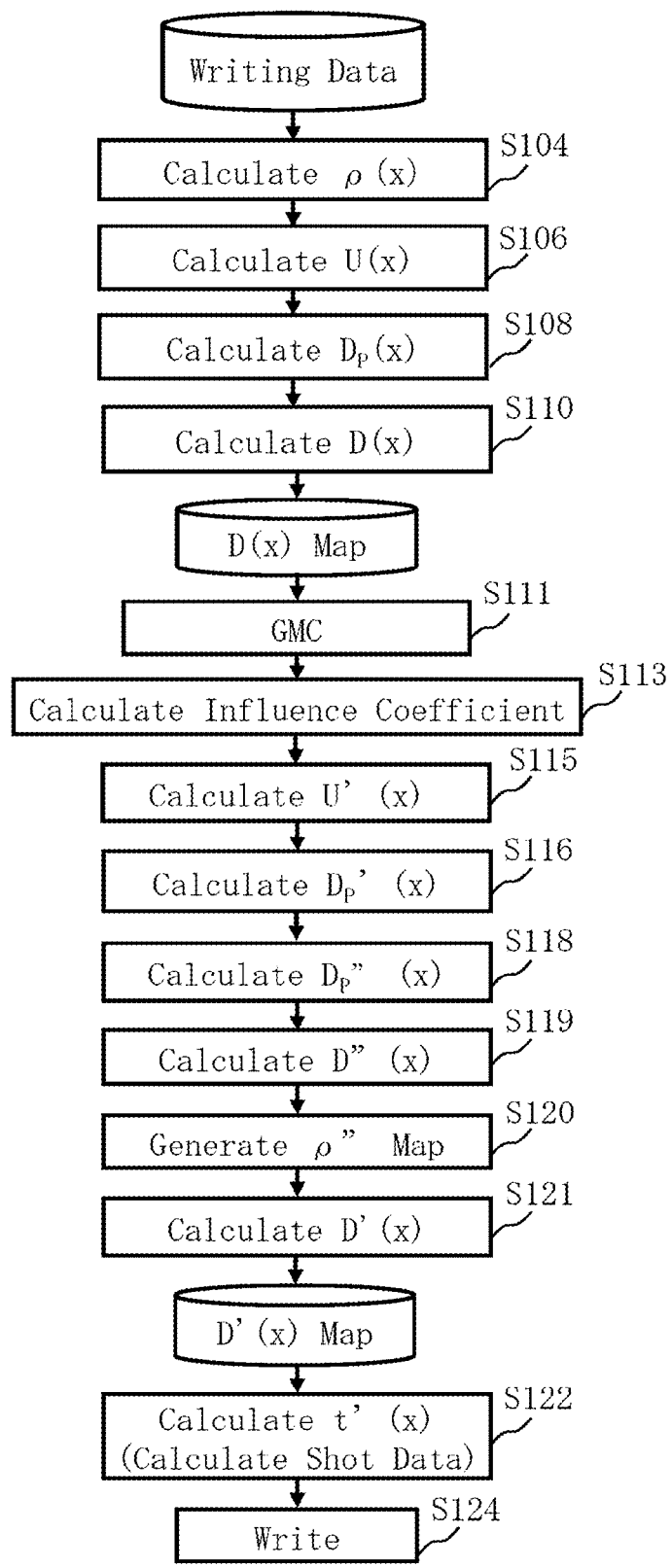
FIG. 4 is a flowchart showing main steps of a writing method according to the first embodiment.

FIG. 4 is a flowchart showing main steps of a writing method according to the first embodiment. As shown in FIG. 4, the writing method of the first embodiment executes a series of steps of a ρ(x) calculation step (S104), a U(x) calculation step (S106), a $D_p$(x) calculation step (S108), a D(x) calculation step (S110), a GMC step (S111), an influence coefficient calculation step (S113), a U'(x) calculation step (S115), a $D_p$'(x) calculation step (S116), a $D_p$"(x) calculation step (S118), a D"(x) calculation step (S119), a ρ" map generation step (S120), a D'(x) calculation step (S121), a t'(x) calculation step (S122), and a writing step (S124).

First, the dividing-into-proximity-meshes unit 62 (second dividing-into-meshes unit) virtually dividing the writing region of the target object 101 into a plurality of proximity meshes (second mesh region) by the size $\Delta_2$ (second mesh size) for correcting a proximity effect. With respect to the proximity mesh, it is preferable to perform dividing by the size about 1/10 of the influence radius of the proximity effect, such as about 0.5 to 2 μm.

In the ρ calculation step (S104), the ρ calculation unit 66 reads writing data from the storage device 540, and calculates, for each proximity mesh, the area density ρ of a figure pattern arranged in the proximity mesh concerned. Then, the ρ calculation unit 66 generates an area density map by using each mesh value. The ρ calculation unit 66 sequentially reads the data file of each frame region, and calculates the area density ρ for each frame region. That is, here, the area density ρ is calculated using writing data before GMC is performed.

In the U(x) calculation step (S106), the U calculation unit 68 calculates a proximity effect density U(x) for each proximity mesh region. The proximity effect density U(x) can be defined by the following equation (1) that convolves a distribution function g(x) with an area density ρ. Hereinafter, the position x indicates a vector. A proximity effect density U(x) map is generated using a mesh value of each proximity mesh region. The U(x) map is stored in the storage device 544.

$$U(x) = \int \rho(x')g(x-x')dx' \quad (1)$$

As one of various effects causing correction residual error of proximity effect, there is effect of modulating the dose for writing at least one of a pattern edge and a pattern corner. Generally, the boundary of a figure pattern and the boundary of a pixel are not coincident with each other. Even in a pattern whose boundary is coincident with the boundary of a pixel, the boundaries may not coincide with each other when the position of the figure pattern is shifted by performing GMC. In such a case, if not modulating the dose of the pixel where the boundaries do not coincide with each other, the shape of at least one of the pattern edge and the pattern corner deviates when the pattern is written. In multi-beam writing, the roundness of the corner becomes large compared to variable-shaped beam (VSB) writing. Therefore, in multi-beam writing, it is particularly necessary to perform correction of the edge corner by modulating the dose.

Depending upon a proximity effect correction coefficient, likelihood (dose latitude: ratio of the CD change amount to the dose change amount) varies. Therefore, the correction coefficient of the dose used for corner correction varies. In the first place, the roundness of the corner may vary depending on a proximity effect.

Thus, in multi-beam writing, correction residual error of proximity effect is easily generated under the influence of modulation of the dose to write at least one of the pattern edge and the pattern corner. Then, according to the first embodiment, there will be described a configuration where suppressed is correction residual error of proximity effect, which is generated under the influence of modulation of the dose to write at least one of the pattern edge and the pattern corner. In the first embodiment, a model using a term obtained by multiplying an incident dose by an influence coefficient α'(x) (an example of an influence coefficient), and a term indicating a back scattering dose is used. Then, the correction dose (proximity effect correction irradiation coefficient) is calculated using the model. For reducing the operation time, according to the first embodiment, proximity effect correction calculation is performed without taking account of the influence of modulation of the dose to write at least one of the pattern edge and the pattern corner. Then, after that, calculation taking account of the influence of modulation of the dose to write at least one of the pattern edge and the pattern corner is performed. Now, first, will be described the case where proximity effect correction calculation is performed without taking account of the influence of modulation of the dose to write at least one of the pattern edge and the pattern corner.

In the $D_p$(x) calculation step (S108), the $D_p$ calculation unit 70 calculates a correction irradiation coefficient $D_p$(x) (first proximity effect correction irradiation coefficient) for correcting a proximity effect without taking account of the influence of modulation of the dose to write at least one of the pattern edge and the pattern corner. The correction irradiation coefficient $D_p$(x) can be obtained by solving the following model equation (2) where an unknown correction irradiation coefficient $D_p$(x) which does not take account of the influence of modulation of the dose to write at least one of the pattern edge and the pattern corner, and a proximity effect correction coefficient η are used. Here, the dose D(x) is replaced by the correction irradiation coefficient $D_p$(x) by defining (using) a standardized dose.

$$\frac{D_p(x)}{2} + \eta \int \rho(x')D_p(x')g(x-x')dx' = \frac{1}{2} + \eta \quad (2)$$

In order to obtain an unknown correction irradiation coefficient $D_p$(x) from the equation (2), a repetition calculation up to the n-th order term (n is an integer of 1 or more) is performed. Therefore, when performing the repetition calculation, the $D_p$ calculation unit 70 sequentially calculates the correction irradiation coefficient term of each order term, from the first order term to the n-th order term. The $D_p$ calculation unit 70 serves as an example of a first correction-irradiation-coefficient-term calculation unit. The correction irradiation coefficient term $d_1$ of the first order term and the correction irradiation coefficient term $d_n$ of the n-th order term are defined by the following equations (3-1) and (3-2).

$$d_1(x) = \frac{\frac{1}{2} + \eta}{\frac{1}{2} + \eta U(x)} \quad (3\text{-}1)$$

$$d_n(x) = \frac{\eta\left\{d_{n-1}U(x) - \int d_{n-1}\rho(x')g(x-x')dx'\right\}}{\frac{1}{2} + \eta U(x)} (n >= 2) \quad (3\text{-}2)$$

The correction irradiation coefficient $D_p(x)$ (first proximity effect correction irradiation coefficient) is defined by the following equation (4). An obtained correction irradiation coefficient $D_p(x)$, and a correction irradiation coefficient term $d_1(x)$ of at least one of the correction irradiation coefficient term of each order term are stored in the storage device 544.

$$D_p(x) = \sum_{k=1}^{n} d_k(x) \qquad (4)$$

In the D(x) calculation step (S110), the D calculation unit 71 (temporary dose calculation unit) calculates, for each pattern, a dose D(x) (temporary dose) by multiplying an obtained correction irradiation coefficient $D_p(x)$ by a reference dose $D_0$.

In the GMC step (S111), the GMC unit 63 (position deviation correction unit) corrects pattern data, based on position deviation of a pattern to be written which which is caused by distortion of at least one of the target object 101 and the mirror 610. Specifically, the GMC unit 63 reads writing data from the storage device 540, and performs GMC for a plurality of figure patterns defined in the writing data. As the GMC, in the first embodiment, a pattern position deviation resulting from distortion of the mirror 610 and/or distortion of the target object 101 is corrected. GMC data used as correction data for correcting the position deviation of a pattern resulting from distortion of the mirror 610 and/or distortion of the target object 101 is stored in the storage device 549. The GMC unit 63 reads GMC data from the storage device 549, and performs GMC by correcting pattern data on a plurality of figure patterns defined in writing data. A polynomial (e.g., fourth function) obtained by approximating the correction value for correcting the position deviation of a pattern resulting from distortion of the mirror 610 and/or distortion of the target object 101, and/or a coefficient of the polynomial are included in the GMC data. Further, included is a correction map defining a correction value for correcting position deviation eccentrically located for which it is difficult to perform approximation by the polynomial. The GMC unit 63 corrects the position of each pattern by using the polynomial or the correction map. Thereby, the position of a pattern can be corrected at the stage of writing data before being developed to shot data.

Next, proximity effect correction calculation taking account of the influence of modulation of the dose to write at least one of the pattern edge and the pattern corner is performed. According to the first embodiment, a model using a term obtained by multiplying the incident dose by an influence coefficient $\alpha'(x)$ (an example of an influence coefficient), and a term of a back scattering dose is used. This model is defined by the following equation (5) using an unknown proximity effect correction irradiation coefficient $D_p'(x)$ taking account of the influence of modulation of the dose to write at least one of the pattern edge and the pattern corner. Here, the dose D'(x) is replaced by the correction irradiation coefficient $D_p'(x)$ by defining (using) a standardized dose.

$$\alpha'(x)D_p'(x) + \eta \int \rho(x')D_p'(x')g(x-x')dx' = \frac{1}{2} + \eta \qquad (5)$$

An unknown proximity effect correction irradiation coefficient $D_p'(x)$ taking account of the influence of modulation of the dose to write at least one of the pattern edge and the pattern corner can be obtained by solving the equation (5). For this, an influence coefficient $\alpha'(x)$ for incident dose is required.

In the influence coefficient calculation step (S113), the a' calculation unit 77 calculates an influence coefficient $\alpha'(x)$, based on the dose D(x) (temporary dose) of the position x which is equivalent to at least one of the pattern edge and the pattern corner. The influence coefficient $\alpha'(x)$ is a function depending on x and the dose D(x). Here, since the GMC has been performed according to the first embodiment, the position x is a position after the GMC. With respect to the pattern edge and the pattern corner where the pattern edge (boundary) is deviated from the pixel boundary, a desired shape of the pattern edge or corner cannot be formed with a design irradiation beam dose thereon. Accordingly, such a point should be irradiated with an increased dose. Moreover, it is also preferable that surrounding pixels (pixel outside pattern) around the position of the pattern edge and the pattern corner are also irradiated by beams. In other words, it is also preferable that pixels around the position of the pattern edge or the pattern corner are irradiated with beams even if the area density of the pixels around the pattern edge or the pattern corner is 0 (zero). The influence coefficient $\alpha'(x)$ can be obtained in advance by experiment, etc. according to the position (edge position, corner position, or internal position) in an evaluation figure pattern and the dose D at that position.

In the U'(x) calculation step (S115), the U' calculation unit 79 calculates, for each proximity mesh region, a proximity effect density U'(x) taking account of the influence coefficient $\alpha'(x)$. The proximity effect density U'(x) can be defined by the following equation (6-1) that convolves a distribution function g(x) with an area density $\rho'(x)$ taking account of an influence coefficient $\alpha'(x)$. The area density $\rho'(x)$ can be defined by the following equation (6-2) using an area density $\rho(x)$ and an influence coefficient $\alpha'(x)$. Since the influence coefficient $\alpha'(x)$ is a function of the position after GMC, when calculating the area density $\rho'(x)$, it is necessary to shift the influence coefficient $\alpha'(x)$ to the position before the GMC. Then, a proximity effect density U'(x) map is generated using the mesh value of each proximity mesh region. The U'(x) map is stored in the storage device 544.

$$U'(x) = \int \rho'(x')g(x-x')dx' \qquad (6-1)$$

$$\rho'(x) = \rho(x)/2\alpha'(x) \qquad (6-2)$$

In the $D_p'(x)$ calculation step (S116), for correcting a proximity effect by electron beams, the $D_p'$ calculation unit 80 calculates correction irradiation coefficient terms up to the k-th order term in the case of calculating, by repetition operation, a correction irradiation coefficient $D_p'(x)$ (second proximity effect correction irradiation coefficient) taking account of the influence of modulation of the dose to write at least one of the pattern edge and the pattern corner. k indicates one of integers from 1 to n. For example, the correction irradiation coefficient term d1' of the first order term is calculated. The $D_p'$ calculation unit 80 is an example of a second correction-irradiation-coefficient-term calculation unit. The correction irradiation coefficient $D_p'(x)$ can be obtained by solving the model equation (5) where an unknown correction irradiation coefficient $D_p'(x)$ taking account of the influence of modulation of the dose to write at least one of the pattern edge and the pattern corner, and a proximity effect correction coefficient $\eta$ are used. Here, the dose D(x) is replaced by the correction irradiation coefficient $D_p'(x)$ by defining (using) a standardized dose.

In order to obtain an unknown correction irradiation coefficient $D_p'(x)$ from the equation (5), a repetition calculation up to the n-th order term (n is an integer of 1 or more) is usually performed. However, according to the first embodiment, the correction irradiation coefficient term $d_1'$ of the first order term which is affected most by modulation of the dose to write at least one of the pattern edge and the pattern corner is calculated. Therefore, it does not need to calculate the second and subsequent order terms. The correction irradiation coefficient term $d_1'$ of the first order term for the correction irradiation coefficient $D_p'(x)$ (second proximity effect correction irradiation coefficient) is a solution of the first order term in the case of solving the model equation (5) by repetition calculation. Although the proximity effect correction calculation takes time, the calculation time can be greatly reduced by calculating only the first order term. It is most desirable for k to be 1 (k=1), but k is not limited to be 1 and may be 2 or more. However, in the case of setting k to be high order of second order or more, calculation up to the k-th order term is needed. The correction irradiation coefficient term $d_1'$ of the first order term is defined by the following equation (7).

$$d_1'(x) = \frac{\frac{1}{2} + \eta}{\frac{1}{2} + \eta U'(x)} \tag{7}$$

Thus, the correction irradiation coefficient term $d_1'$ of the first order term for the correction irradiation coefficient $D_p'(x)$ (second proximity effect correction irradiation coefficient) taking account of the influence of modulation of the dose to write at least one of the pattern edge and the pattern corner can be calculated using a proximity effect density $U'(x)$ which is a convolution value between a distribution function and the area density $\rho'(x)$ taking account of the influence of modulation of the dose to write at least one of the pattern edge and the pattern corner. With respect to the proximity effect density $U'(x)$, the one which has already been calculated can be read from the storage device 544. The proximity effect density $U'(x)$ is based on the position of the figure pattern before GMC. This is because the correction calculation of a proximity effect should be calculated based on the position on the surface of the target object, and if calculated based on the position after the GMC, since it is shifted from the design position, an error will occur in correction of the proximity effect. Thus, the correction irradiation coefficient term $d_1'$ of the first order term for the correction irradiation coefficient $D_p'(x)$ (second proximity effect correction irradiation coefficient) is calculated using the area density $\rho'(x)$ obtained from pattern data before GMC of the writing data. That is, the area density $\rho(x)$ obtained from the pattern data before GMC is used.

In the $D_p''(x)$ calculation step (S118), the $D_p''$ calculation unit 82 (proximity-effect-correction-irradiation-coefficient calculation unit) calculates a correction irradiation coefficient $D_p''(x)$ (third proximity effect correction irradiation coefficient) where the correction irradiation coefficient terms up to the k-th order term, in the correction irradiation coefficient term of each order term, from the first order term to the n-th order term, for the correction irradiation coefficient $D_p(x)$ (first proximity effect correction irradiation coefficient) which does not take account of the influence of modulation of the dose to write at least one of the pattern edge and the pattern corner are replaced by the correction irradiation coefficient terms up to the k-th order term for the correction irradiation coefficient $D_p'(x)$ (second proximity effect correction irradiation coefficient) taking account of the influence of modulation of the dose to write at least one of the pattern edge and the pattern corner. Here, the correction irradiation coefficient $D_p''(x)$ (third proximity effect correction irradiation coefficient) is calculated in which, in the correction irradiation coefficient term of each order term, from the first order term to the n-th order term, for the correction irradiation coefficient $D_p(x)$ (first proximity effect correction irradiation coefficient) which does not take account of the influence of modulation of the dose to write at least one of the pattern edge and the pattern corner, the correction irradiation coefficient term $d_1$ of the first order term is replaced by the correction irradiation coefficient term $d_1'$ of the first order term for the correction irradiation coefficient $D_p'(x)$ (second proximity effect correction irradiation coefficient) taking account of the influence of modulation of the dose to write at least one of the pattern edge and the pattern corner. The $D_p''$ calculation unit 82 is an example of a proximity-effect-correction-irradiation-coefficient calculation unit. That is, the correction irradiation coefficient $D_p''(x)$ is defined by the following equation (8).

$$D_p''(x) = D_p(x) - d_1(x) + d_1'(x) \tag{8}$$

The dose D is needed for calculating an influence coefficient $\alpha'(x)$ taking account of the influence of modulation of the dose to write at least one of the pattern edge and the pattern corner. Therefore, first of all, it is necessary to calculate the dose D as described above. After that, although it is acceptable to calculate, to the high order term, the correction irradiation coefficient $D_p'(x)$ taking account of the influence of modulation of the dose to write at least one of the pattern edge and the pattern corner by performing a proximity effect correction calculation taking account of the influence of modulation of the dose to write at least one of the pattern edge and the pattern corner, the calculation time becomes very long, and therefore, it is difficult to calculate in real time in accordance with the advance of writing processing. Then, according to the first embodiment, calculated is only the correction irradiation coefficient term $d_1'$ of the first order term which is affected most by modulation of the dose to write at least one of the pattern edge and the pattern corner, and then, the correction irradiation coefficient term $d_1$ of the first order term of the correction irradiation coefficient $D_p(x)$ which has already been calculated is replaced by the calculated correction irradiation coefficient term $d_1'$ of the first order term, thereby greatly reducing the calculation time. Moreover, since the correction irradiation coefficient $D_p''(x)$ which has been obtained by this replacement includes the correction irradiation coefficient term $d_1'$ of the first order term which is affected most by modulation of the dose to write at least one of the pattern edge and the pattern corner, it is possible to perform proximity effect correction taking account of the influence of modulation of the dose to write at least one of the pattern edge and the pattern corner.

As described above, the correction irradiation coefficient term calculated for the correction irradiation coefficient $D_p'(x)$ is not limited to the first order term. In the case of calculating the correction irradiation coefficient term of the second or subsequent order term, in the correction irradiation coefficient terms of from the first order term to the n-th order term for the correction irradiation coefficient $D_p(x)$ (first proximity effect correction irradiation coefficient), the correction irradiation coefficient term of a certain order term should be replaced by the correction irradiation coefficient term of the correction irradiation coefficient $D_p'(x)$ whose order term is the same as the certain order term. Although the calculation time becomes longer than that of the case where the correction irradiation coefficient term of the first order term is replaced, the correction residual error of proximity effect correction can be reduced.

In the D"(x) calculation step (S119), the D" calculation unit 72 calculates, for each pattern, a dose D"(x) by multiplying an obtained correction irradiation coefficient $D_p''(x)$ (third proximity effect correction irradiation coefficient) by the reference dose $D_0$.

In the ρ" map generation step (S120), the ρ" map generation unit 65 calculates, for each pixel region of a plurality of mesh regions (pixel regions) obtained by virtually dividing the writing region of the target object 101 or a chip region to be written, an area density ρ"(x) of a pattern arranged in each pixel region, by using a figure pattern for which GMC has been performed and defined in the writing data. For example, first, the writing region of the target object 101 or the chip region to be written is divided into strip-shaped stripe regions by a predetermined width. Then, each stripe region is virtually divided into a plurality of pixel regions. The size of the pixel region is preferably, for example, a beam size, or smaller than the beam size. For example, it is preferable for the size to be about 10 nm. The ρ" map generation unit 65 assigns, for each stripe region, corresponding figure patterns of a plurality of figure patterns defined in writing data to a pixel region, for example. Then, the area density ρ"(x) of a figure pattern arranged in each pixel region should be calculated. The area density (ρ") map is generated for each stripe region.

In the D'(x) calculation step (S121), the D' calculation unit 84 calculates a dose for each pixel region. Specifically, the dose D'(x) is calculated by multiplying a dose D"(x) of a figure pattern for which GMC has been performed, an area density ρ"(x) defined in the ρ" map, and 1/(2α'(x)). Then, a dose D'(x) map is generated using the mesh value of each pixel region. The D'(x) map is stored in the storage device 548.

In the t'(x) calculation step (S122), the t' calculation unit 85 calculates, for each pixel region, an irradiation time t'(x). The irradiation time t'(x) can be obtained by dividing the dose D'(x) by the current density J. The irradiation time t'(x) having been obtained for each pixel region is defined as shot data, and is temporarily stored in the storage device 542.

In the writing step (S124), the writing control unit 86 controls the writing mechanism 550 through deflection control circuit 530, and starts writing processing. The writing mechanism 550 writes a pattern on the target object 101, using the multi-beams 20, based on the calculated dose D'(x) (irradiation time t'(x)). Specifically, it operates as described below.

The electron beam 600 emitted from the electron gun 201 (emitter) almost perpendicularly (e.g., vertically) illuminates the whole of the multi-beam forming member 603 by the illumination lens 502. A plurality of holes (openings) each being a quadrangle are formed in the multi-beam forming member 603. The region including all the plurality of holes is irradiated by the electron beam 600. For example, a plurality of quadrangular electron beams (multi-beams) 20a to 20e are formed by letting portions of the electron beam 600 which irradiate the positions of a plurality of holes individually pass through a corresponding hole of the plurality of holes of the multi-beam forming member 603. The multi-beams 20a to 20e individually pass through a corresponding blanker (first deflector: individual blanking mechanism) of the blanking plate 604. Each blanker deflects (blanking deflects) the electron beam 20 which is individually passing.

The multi-beams 20a, 20b, . . . , 20e having passed through the blanking plate 604 are reduced by the reducing lens 605, and go toward the hole in the center of the limiting aperture member 606. At this stage, the electron beam 20 which was deflected by the electrodes 24 and 26 (blanker) of the blanking plate 604 deviates from the hole in the center of the limiting aperture member 606 and is blocked by the limiting aperture member 606. On the other hand, the electron beam 20 which was not deflected by the electrodes 24 and 26 (blanker) of the blanking plate 604 passes through the hole in the center of the limiting aperture member 606 as shown in FIG. 1. Blanking control is performed by ON/OFF of the individual blanking mechanism so as to control ON/OFF of beams. Thus, the limiting aperture member 606 blocks each beam which was deflected to be in a beam OFF state by the individual blanking mechanism. Then, one shot beam is formed by a beam which has been made during a period from becoming a beam ON state to becoming a beam OFF state and has passed through the limiting aperture member 606. The multi-beams 20 having passed through the limiting aperture member 606 are focused by the objective lens 607 in order to be a pattern image of a desired reduction ratio, and respective beams (the entire multi-beams 20) having passed through the limiting aperture member 606 are collectively deflected in the same direction by the deflector 608 in order that respective beam irradiation positions on the target object 101 may be irradiated. While the XY stage 505 is continuously moving, controlling is performed by the deflector 608 so that irradiation positions of beams may follow (track) the movement of the XY stage 505, for example. The position of the XY stage 505 is measured by way of radiating a laser from the stage position detector 539 to the mirror 610 on the XY stage 505 and using its catoptric light. The multi-beams 20 irradiating at the same time are ideally aligned at pitches obtained by multiplying the arrangement pitch of a plurality of holes of the aperture member 603 by a desired reduction ratio described above. The writing apparatus 500 performs a writing operation by the raster scan method which sequentially irradiates shot beams, and when writing a desired pattern, a beam required according to a pattern is controlled to be ON by blanking control.

As described above, the writing region of the target object 101 is virtually divided into a plurality of strip-shaped stripe regions each having a predetermined width in the y direction, for example. Each of the stripe regions serves as a unit region for writing. The XY stage 505 is moved to make an adjustment such that an irradiation region which can be irradiated by one irradiation of the multi-beams 20 is located at the left end of the first stripe region or at a position more left than the left end, and then writing is started. When writing the first stripe region, the writing advances relatively in the x direction by moving the XY stage 505 in the −x direction, for example. The XY stage 505 is continuously moved at a predetermined speed, for example. After writing the first stripe region, the stage position is moved in the −y direction to make an adjustment such that the irradiation region is located at the right end of the second stripe region or at a position more right than the right end to be relatively located in the y direction. Then, similarly, writing advances in the −x direction by moving the XY stage 505 in the x direction, for example. That is, writing is performed while alternately changing the direction, such as performing writing in the x direction in the third stripe region, and in the −x direction in the fourth stripe region, and thus, the writing time can be reduced. However, the writing operation is not limited to the case of performing writing while alternately changing the direction, and it is also acceptable to perform writing in the same direction when writing each stripe region. By one shot, a plurality of shot patterns of the same number as the number of the holes 22 are formed at a time by multi-beams which have been formed by passing through respective corresponding holes 22 of the multi-beam forming member 603.

Figure 5:
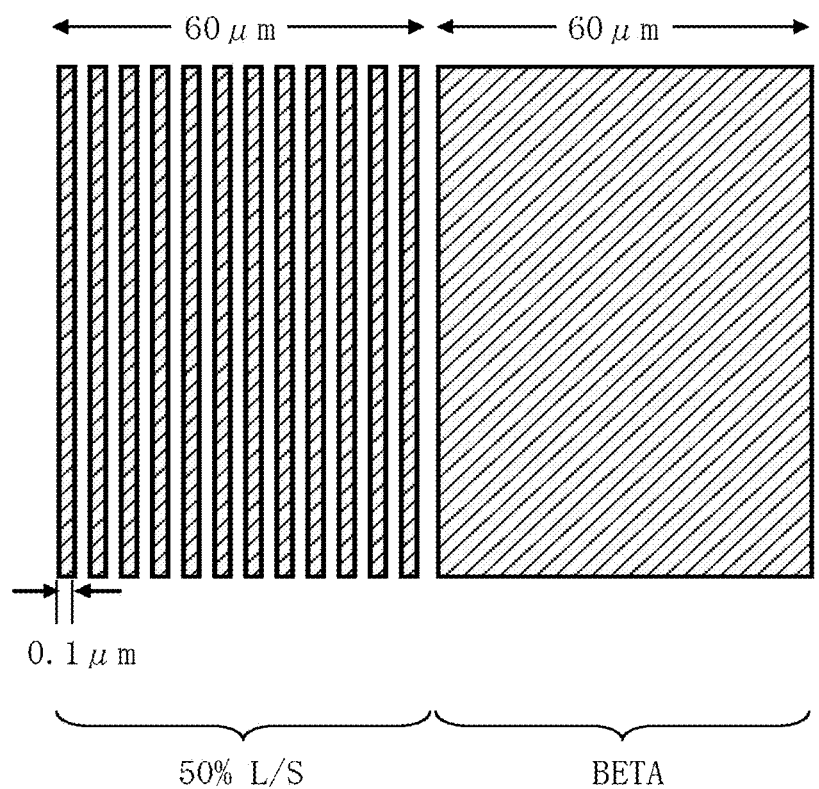
FIG. 5 shows an example of an evaluation pattern for evaluating an effect of the first embodiment.

FIG. 5 shows an example of an evaluation pattern for evaluating an effect of the first embodiment. In FIG. 5, the half (60 μm wide) of the evaluation pattern (120 μm wide) serves as a 1:1 line and space pattern (line width of 0.1 μm) whose area density is 50%. The other half (60 μm wide) is a so-called solid pattern whose area density is 100%. The evaluation pattern is written under different conditions.

Figure 6A:
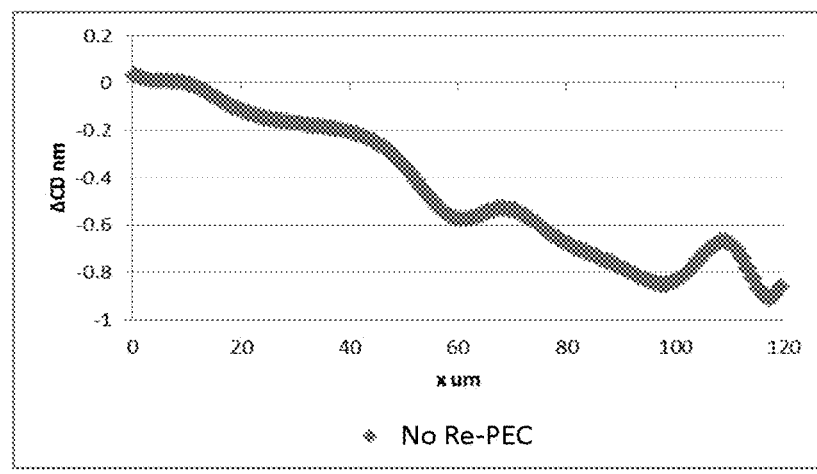
FIGS. 6A and 6B show examples of the result of dimensional deviation in the case of writing an evaluation pattern under the conditions of comparative examples 1 and 2 of the first embodiment.
Figure 6B:
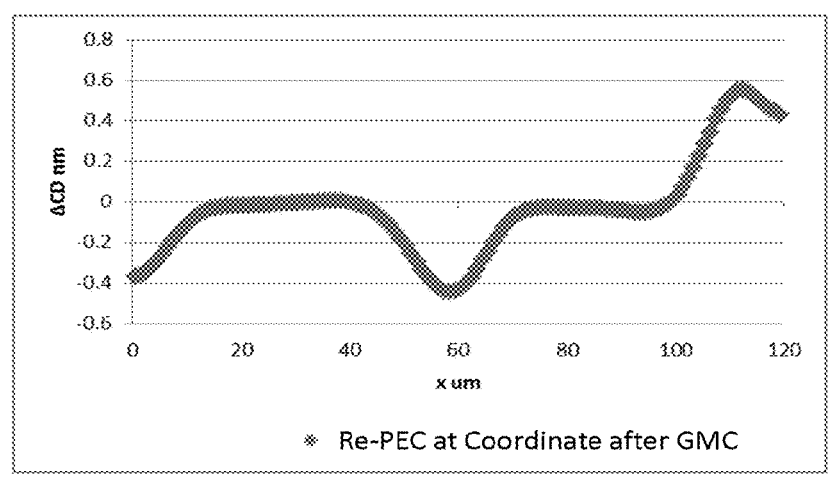
Figure 7:
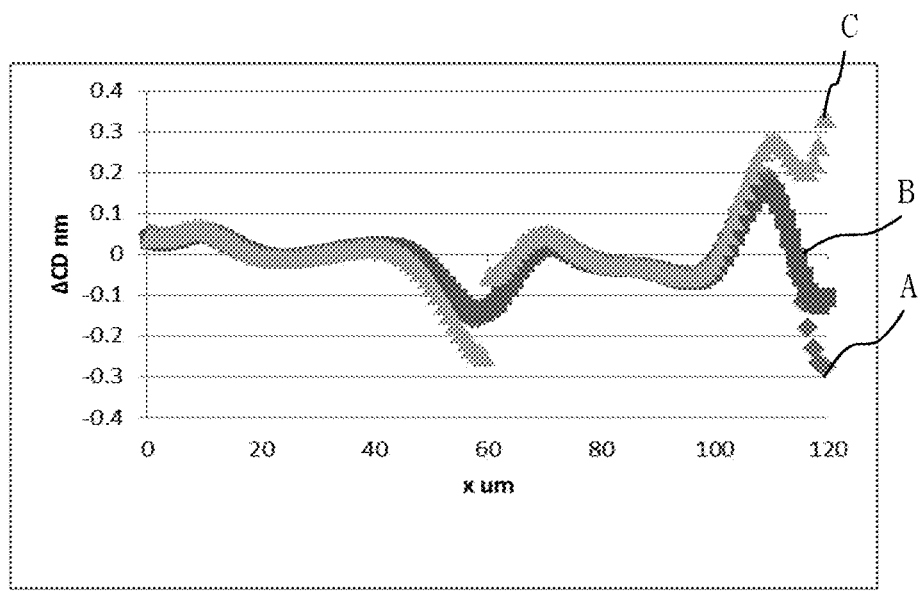
FIG. 7 shows an example of the result of dimensional deviation in the case of writing an evaluation pattern according to the first embodiment.

FIGS. 6A and 6B show examples of the result of dimensional deviation in the case of writing an evaluation pattern under the conditions of comparative examples 1 and 2 of the first embodiment. FIG. 7 shows an example of the result of dimensional deviation in the case of writing an evaluation pattern according to the first embodiment. In FIGS. 6A and 6B and FIG. 7, the ordinate axis denotes a dimensional deviation amount ΔCD and the abscissa axis denotes the position x of an evaluation pattern. FIG. 6A shows the result of dimensional deviation in the case of writing an evaluation pattern in multi-beam writing without re-executing proximity effect correction calculation after modulation of the dose to write at least one of the pattern edge and the pattern corner. FIG. 6B shows the case, in multi-beam writing, where the proximity effect density U'(x) is calculated based on the position of a figure pattern for which GMC has been performed, in re-executing proximity effect correction calculation after modulation of the dose to write at least one of the pattern edge and the pattern corner. It turns out that, as shown in FIG. 6A, the deviation amount (ΔCD) of the line width critical dimension (CD) of a pattern to be written is large when proximity effect correction calculation is not re-executed after modulation of the dose to write at least one of the pattern edge and the pattern corner. As shown in FIG. 6B, even when proximity effect correction calculation is re-executed after modulation of the dose to write at least one of the pattern edge and the pattern corner, ΔCD is still large when correction calculation is executed based on the position of the figure pattern for which GMC has been performed, although ΔCD has been improved compared to the case where proximity effect correction calculation is not re-executed.

By contrast, according to the first embodiment, the correction irradiation coefficient $D_p''(x)$ is obtained by calculating only the correction irradiation coefficient term $d_1'$ of the first order term for calculating an unknown correction irradiation coefficient $D_p'(x)$, and replacing the correction irradiation coefficient term $d_1$ of the first order term of the correction irradiation coefficient $D_p(x)$, which has already been obtained, by the correction irradiation coefficient term $d_1'$ of the first order term (PEC mode 2 case). The graph B in FIG. 7 shows the result of the first embodiment. The graph A in FIG. 7 shows the result of calculating the correction irradiation coefficient $D_p'(x)$ by performing repetition calculation from the first order term to the n-th order term (n is an integer of 1 or more) and adding each correction irradiation coefficient term from the first order term to the n-th order term in order to obtain an unknown correction irradiation coefficient $D_p'(x)$ (PEC mode 1 case). The graph C in FIG. 7 shows the result of calculating the correction irradiation coefficient $D_p''(x)$ by using the area density ρ'(x) which is not to be convolved, as will be described later, when calculating only the correction irradiation coefficient term $d_1'$ of the first order term in order to obtain an unknown correction irradiation coefficient $D_p'(x)$ (PEC mode 3 case). With respect to the dimensional deviation amount ΔCD at each position x, there is no great difference between the results of the graphs B and C and the result of the graph A. That is, it turns out that correction has been performed successfully.

As described above, according to the first embodiment, even in writing processing of a multi-beam system, it is possible to greatly reduce the operation time so that the correction calculation speed may not be slower than the writing speed. Furthermore, it is possible to efficiently suppress pattern dimensional variation due to modulation of the dose to write at least one of the pattern edge and the pattern corner while suppressing correction residual error of proximity effect. Thus, it is possible to efficiently suppress pattern dimensional variation due to various effects while suppressing correction residual error of proximity effect. Therefore, pattern writing can be performed with high dimension accuracy.

Although GMC (grid matching correction) is performed in the examples described above, it is not limited thereto. The case without performing GMC is acceptable.

Second Embodiment

According to the first embodiment, when calculating the correction irradiation coefficient term $d_1'$ of the first order term for obtaining a correction irradiation coefficient $D_p'(x)$ taking account of the influence of modulation of the dose to write at least one of the pattern edge and the pattern corner, a proximity effect density U(x) obtained by convolving the area density ρ with the distribution function g is used, but it is not limited thereto. According to the second embodiment, calculation different from that of the first embodiment will be described. In the second embodiment, the configuration of the writing apparatus is the same as that of FIG. 1. The flowchart of the writing method is the same as that of FIG. 4. The contents of the second embodiment are the same as those of the first embodiment except for what is specifically described below.

The only difference between the first and second embodiments is the equation for calculating the correction irradiation coefficient term d1' of the first order term in the case of obtaining, by repetition calculation, the correction irradiation coefficient $D_p'(x)$ (second proximity effect correction irradiation coefficient) taking account of influence of modulation of the dose to write at least one of the pattern edge and pattern corner described in the $D_p'(x)$ calculation step (S116). The correction irradiation coefficient term d1' of the first order term according to the second embodiment is defined by the following equation (9).

$$d_1'(x) = \frac{\frac{1}{2} + \eta}{\frac{1}{2} + \eta \rho'(x)} \tag{9}$$

As shown in the equation (9), the correction irradiation coefficient term d1' of the first order term for the correction irradiation coefficient $D_p'(x)$ (second proximity effect correction irradiation coefficient) taking account of influence of modulation of the dose to write at least one of the pattern edge and pattern corner is calculated using the area density without convolution. In other words, the area density ρ'(x) is used instead of the proximity effect density U'(x). By performing this calculation, the influence of modulation of the dose to write at least one of the pattern edge and the pattern corner can be taken into account.

The graph C of FIG. 7 described above shows an example of the result of dimensional deviation in the case of writing an evaluation pattern under the conditions according to the second embodiment. With respect to the equation (7) described above, in the second embodiment, when calculating only the correction irradiation coefficient term $d_1'$ of the first order term in order to obtain an unknown correction irradiation coefficient $D_p'(x)$, the area density ρ'(x) which is not to be convolved is used instead of the proximity effect density U'(x). The others are the same as those of the first embodiment (PEC mode 2). Then, based on these contents, the correction irradiation coefficient $D_p''(x)$ is calculated (PEC mode 3). FIG. 7 shows the result of dimensional deviation in the case of writing an evaluation pattern based on the dose calculated by using the correction irradiation coefficient $D_p''(x)$ of the second embodiment. In the second embodiment, when the graph C of FIG. 7 is compared with the graphs A and B of FIG. 7, the accuracy degrades at the position where a line and space pattern and a solid pattern are connected with each other and the position near the end of the evaluation pattern, but, there is no great difference with respect to the dimensional deviation amount ΔCD at each position x in the central part of the line and space pattern and central part of the solid pattern. That is, it turns out that correction has been performed successfully.

As described above, according to the second embodiment, it is possible to obtain effects almost equivalent to those of the first embodiment. Furthermore, correction calculation can be simplified more than that of the first embodiment.

Although GMC (grid matching correction) is performed in the examples described above, it is not limited thereto. The case without performing GMC is acceptable.

Third Embodiment

In the first and second embodiments, there has been described a multi-beam writing apparatus. However, correction residual error of proximity effect correction generated by dimensional variation due to various effects, namely residual error of proximity effect correction due to various effects, is not limited to multi-beam writing. It is also generated in a single beam system, such as a raster beam writing system and a variable shaped beam writing system (VSB writing system). For example, when modulating the dose in order to improve the resolution of a small-sized pattern, or when modulating the dose in order to correct an EUV short range proximity effect, residual error of proximity effect correction is also generated in a single beam system as well as multi-beam system. In the third embodiment, there will be described a configuration where suppressed is correction residual error of proximity effect correction, which is generated due to modulation of the dose in order to improve resolution of a small-sized pattern in the variable shaped beam writing apparatus.

Figure 8:
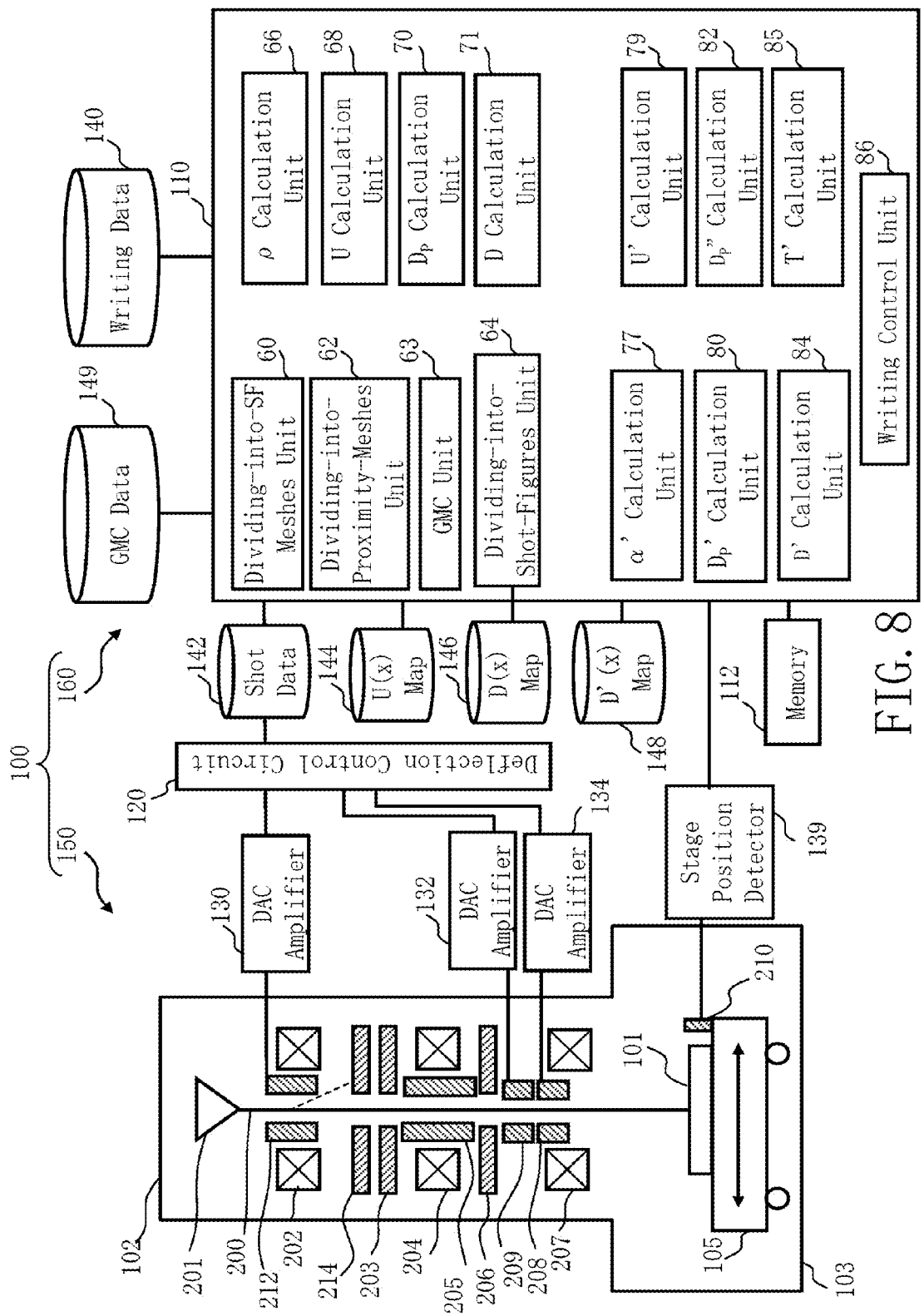
FIG. 8 is a schematic diagram showing a configuration of a writing apparatus according to a third embodiment.

FIG. 8 is a schematic diagram showing a configuration of a writing apparatus according to the third embodiment. In FIG. 8, a writing apparatus 100 includes a writing mechanism 150 and a control unit 160. The writing apparatus 100 is an example of a charged particle beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201, an illumination lens 202, a blanking deflector (blanker) 212, a blanking aperture 214, a first shaping aperture plate 203, a projection lens 204, a deflector 205, a second shaping aperture plate 206, an objective lens 207, a main deflector 208 and a sub deflector 209. In the writing chamber 103, there is arranged an XY stage 105 that is movable at least in the x-y direction. On the XY stage 105, there are placed a mirror 210 for measuring the stage position, and a target object 101 (substrate) serving as a writing target on which resist has been applied. The target object 101 is an exposure mask, a silicon wafer, and the like used for manufacturing semiconductor devices. The mask may be, for example, a mask blank.

The control unit 160 includes a control computer unit 110, a memory 112, a deflection control circuit 120, a DAC (digital-analog converter) amplifier units 130, 132, and 134 (deflection amplifiers), a stage position detector 139, and storage devices 140, 142, 144, 146, 148, and 149 such as magnetic disk drives. The control computer unit 110, the memory 112, the deflection control circuit 120, the stage position detector 139, and the storage devices 140, 142, 144, 146, 148, and 149 are connected with each other through a bus (not shown). The deflection control circuit 120 is connected to the DAC amplifier units 130, 132 and 134. The DAC amplifier unit 130 is connected to the blanking deflector 212. The DAC amplifier unit 132 is connected to the sub deflector 209. The DAC amplifier unit 134 is connected to the main deflector 208.

In the control computer unit 110, there are arranged a dividing-into-subfield (SF) meshes unit 60, the dividing-into-proximity-meshes unit 62, the grid matching correction (GMC) unit 63, a dividing-into-shot-figures unit 64, the area density (ρ) calculation unit 66, the proximity effect density (U) calculation unit 68, the irradiation correction coefficient ($D_p$) calculation unit 70, the dose (D) calculation unit 71, the influence coefficient (α') calculation unit 77, the U' calculation unit 79, the irradiation correction coefficient ($D_p'$) calculation unit 80, the irradiation correction coefficient ($D_p''$) calculation unit 82, the dose (D') calculation unit 84, the irradiation time (t') calculation unit 85, and the writing control unit 86. Each of the "units" such as the dividing-into-SF meshes unit 60, the dividing-into-proximity-meshes unit 62, the GMC) unit 63, the dividing-into-shot-figures unit 64, the ρ calculation unit 66, the U calculation unit 68, the $D_p$ calculation unit 70, the D calculation unit 71, the influence coefficient (α') calculation unit 77, the U' calculation unit 79, the $D_p'$ calculation unit 80, the $D_p''$ calculation unit 82, the D' calculation unit 84, the t' calculation unit 85, and the writing control unit 86 includes a processing circuitry. As the processing circuitry, for example, an electric circuit, a computer, a processor, a circuit board, a quantum circuit, or a semiconductor device may be used. Each of the "units" may use a common processing circuitry (same processing circuitry), or different processing circuitries (separate processing circuitries). Input data required in the control computer unit 110, and calculated results are stored in the memory 112 each time. It is preferable that computers such as a plurality of CPUs or a plurality of GPUs are arranged for the "-unit" requiring a large amount of calculation.

Writing data is input from the outside of the writing apparatus 100, and stored in the storage device 140. GMC data is input from the outside of the writing apparatus 100, and stored in the storage device 149.

FIG. 8 shows a configuration necessary for explaining the third embodiment. Other configuration elements generally necessary for the writing apparatus 100 may also be included.

Figure 9:
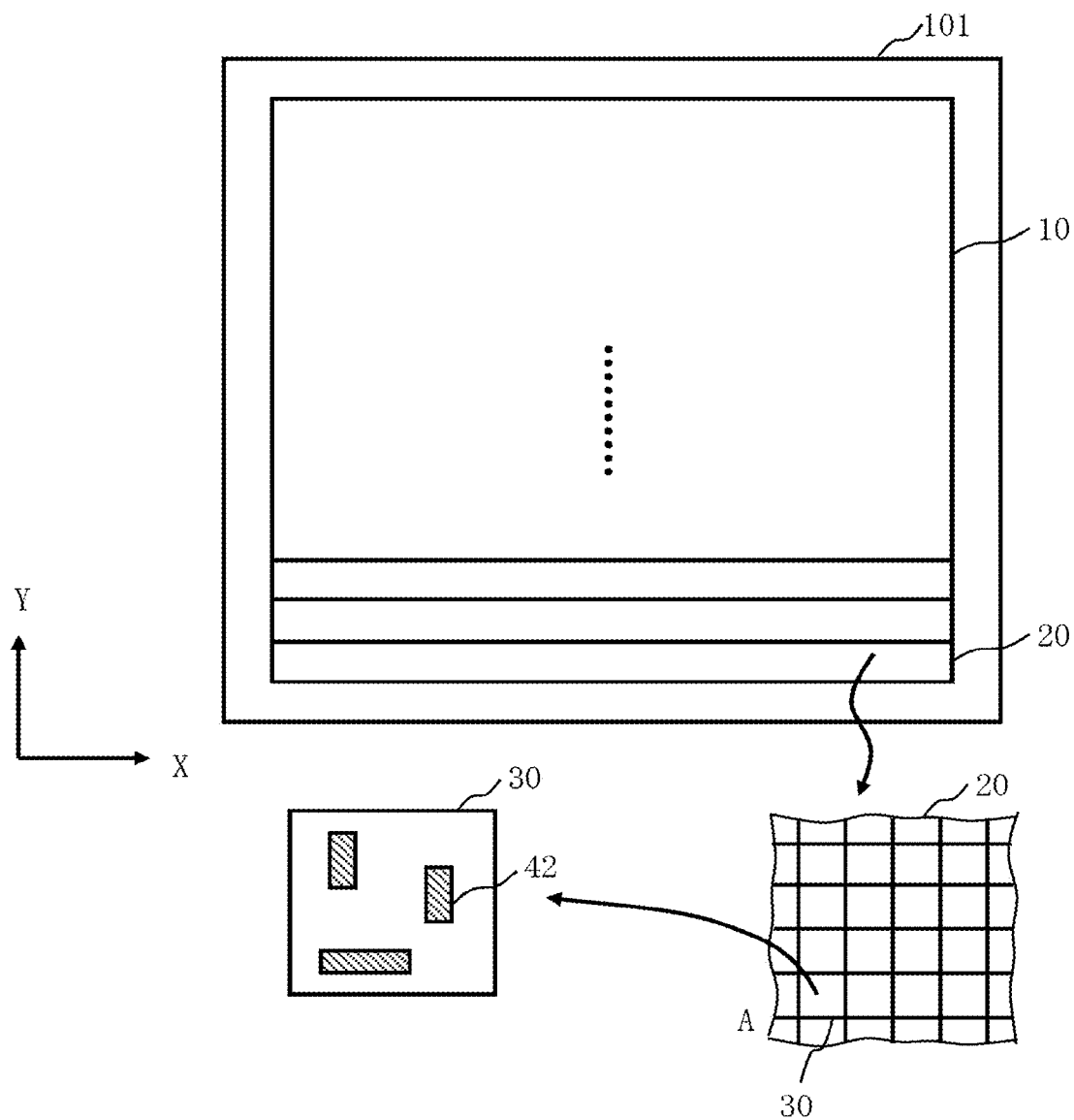
FIG. 9 is a conceptual diagram for explaining each region according to the third embodiment.

FIG. 9 is a conceptual diagram for explaining each region according to the third embodiment. In FIG. 9, a writing region 10 of the target object 101 is virtually divided into a plurality of stripe regions 20 arrayed, for example, along the y direction, each being in a strip shape and each having a width deflectable by the main deflector 208. Further, each of the stripe regions 20 is virtually divided into a plurality of mesh-like subfields (SFs) 30 (small regions) each having a size deflectable by the sub deflector 209. A shot figure is written at a corresponding shot position 42 in each SF 30. Although, in the example of FIG. 9, the SF 30 is the minimum deflection region, it is not limited thereto. For example, each SF may be further divided virtually into a plurality of small mesh-like under subfields (TF: Tertiary Field). In that case, a sub-sub deflector should be further arranged as the third stage deflector in addition to the two-stage deflector composed of the main deflector and the sub deflector.

A digital signal for blanking control is output from the deflection control circuit 120 to the DAC amplifier unit 130. Then, in the DAC amplifier unit 130, the digital signal is converted to an analog signal and amplified to be applied as a deflection voltage to the blanking deflector 212. The electron beam 200 is deflected by this deflection voltage, and thereby a beam of each shot is formed.

A digital signal for main deflection control is output from the control circuit 120 to the DAC amplifier 134. Then, in the DAC amplifier 134, the digital signal is converted to an analog signal and amplified to be applied as a deflection voltage to the main deflector 208. The electron beam 200 is deflected by this deflection voltage, and thereby each beam shot is deflected to a reference position in a predetermined subfield (SF) in the virtually divided mesh like SFs.

A digital signal for sub deflection control is output from the control circuit 120 to the DAC amplifier 132. Then, in the DAC amplifier 132, the digital signal is converted to an analog signal and amplified to be applied as a deflection voltage to the sub deflector 209. The electron beam 200 is deflected by the deflection voltage, and the beam of each shot is deflected to each shot position in a predetermined mesh-like subfield (SF) obtained by virtual division into meshes.

The writing apparatus 100 performs writing processing for each stripe region 20 by using a multiple stage deflector. Here, as an example, a two-stage deflector composed of the main deflector 208 and the sub deflector 209 is used. While the XY stage 105 is continuously moving in the −x direction, for example, writing is performed in the x direction in the first stripe region 20. After the writing has been finished in the first stripe region 20, writing is carried out in the same direction or in the opposite direction in the second stripe region 20. Then, in the same way, writing is performed in the third and subsequent stripe regions 20. The main deflector 208 (first deflector) sequentially deflects the electron beam 200 to a reference position A of the SF 30 such that the movement of the XY stage 105 is followed. The sub deflector 209 (second deflector) deflects the electron beam 200 from the reference position A of each SF 30 to each shot position 42 of an irradiating beam in the SF 30 concerned. Thus, the sizes of the deflection regions of the main deflector 208 and the sub deflector 209 are different from each other.

Figure 10:
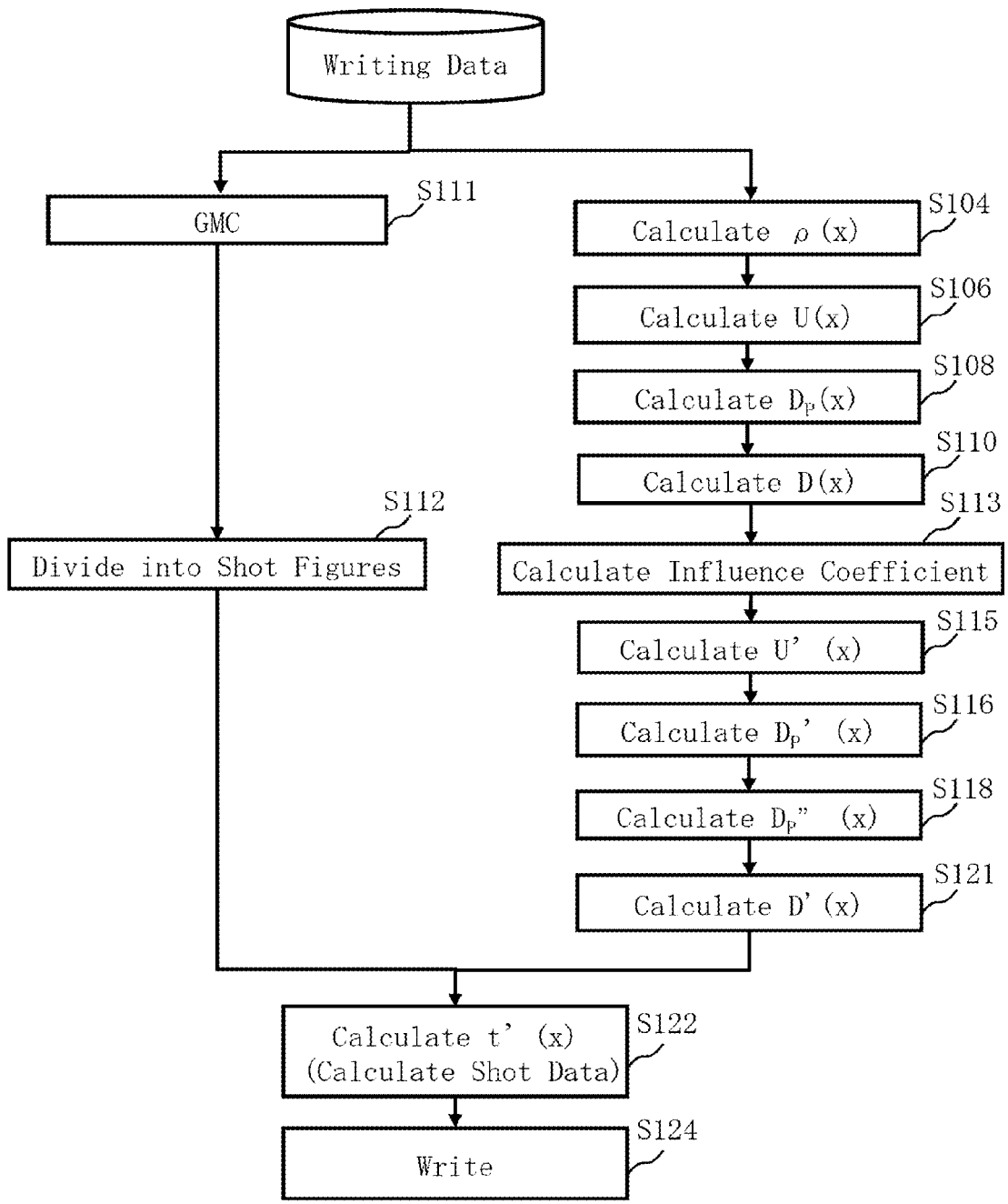
FIG. 10 is a flowchart showing main steps of a writing method according to the third embodiment.

FIG. 10 is a flowchart showing main steps of a writing method according to the third embodiment. As shown in FIG. 10, the writing method of the third embodiment executes a series of steps of the $\rho(x)$ calculation step (S104), the U(x) calculation step (S106), the $D_p(x)$ calculation step (S108), the D(x) calculation step (S110), the GMC step (S111), a dividing-into-shot-figures step (S112), the influence coefficient calculation step (S113), the U'(x) calculation step (S115), the $D_p'(x)$ calculation step (S116), the $D_p''(x)$ calculation step (S118), the D'(x) calculation step (S121), the t'(x) calculation step (S122) and the writing step (S124).

First, the dividing-into-SF meshes unit 60 (first dividing-into-meshes unit) virtually divides the writing region of the target object 101 into a plurality of mesh-like SFs 30 (first mesh region) by the size $\Delta_1$ (first mesh size) which can be deflected by the sub deflector 209. Here, the stripe region 20 is divided into a plurality of mesh-like SFs 30.

Then, the dividing-into-proximity-meshes unit 62 (second dividing-into-meshes unit) virtually dividing the writing region of the target object 101 into a plurality of proximity meshes (second mesh region) by the size $\Delta_2$ (second mesh size) for correcting a proximity effect. With respect to the proximity mesh, it is preferable to perform dividing by the size about 1/10 of the influence radius of the proximity effect, such as about 0.5 to 2 μm.

The contents of each of the steps from the $\rho(x)$ calculation step (S104) to the GMC step (S111) are the same as those of the first embodiment or the second embodiment. However, the storage device 540 should be read as the storage device 140. The storage device 544 should be read as the storage device 144. The mirror 610 should be read as the mirror 210. The storage device 549 should be read as the storage device 149.

In the dividing-into-shot-figures step (S112), the dividing-into-shot-figures unit 64 performs, for writing data which has been GMC corrected, data conversion processing of a plurality of steps so as to generate apparatus-specific shot data for the writing apparatus 100. The file structure of the writing data is formed, for example, for each frame region obtained by virtually dividing the chip region of a writing target chip into strip-like regions. The dividing-into-shot-figures unit 64 reads the data file for each frame region in sequence to generate shot data. It is preferable that each frame region is corresponding to each stripe region serving as a writing unit region. However, it is not limited thereto. For example, it is also preferable to obtain regions by dividing the stripe region. Moreover, although a plurality of figure patterns are arranged in a chip, the size which can be formed by one beam shot is restricted in the writing apparatus 100. Therefore, each figure pattern is divided, in the data conversion processing, into shot figures each having a size that can be irradiated by one beam shot. A figure type, figure size, position, and the like of each shot figure are generated as shot data. The shot data is stored in sequence in the storage device 142.

Next, performed is proximity effect correction calculation taking account of influence of modulation of the dose to improve the resolution of a small-sized pattern. Similarly to the first embodiment, a model is used in which the term obtained by multiplying the incident dose by the influence coefficient α'(x) (an example of an influence coefficient) and the term of back scattering dose are used.

The contents of the influence coefficient calculation step (S113), the U'(x) calculation step (S115), and the $D_p'(x)$ calculation step (S116) are the same as those of the first embodiment. However, the storage device 544 should be read as the storage device 144. Moreover, according to the third embodiment, since the influence coefficient α'(x) is not affected by GMC, the influence coefficient $\alpha'(x)$ is calculated at the position before GMC.

By the step described above, the correction irradiation coefficient term $d1'$ of the first order term for the correction irradiation coefficient $D_p'(x)$ (second proximity effect correction irradiation coefficient) taking account of the influence of modulation of the dose to improve the resolution of a small-sized pattern is calculated using the proximity effect density $U'(x)$ which is a convolution value between a distribution function and the area density $\rho'(x)$ taking account of the influence of modulation of the dose to improve the resolution of a small-sized pattern. With respect to the proximity effect density $U'(x)$, the one which has already been calculated can be read from the storage device 144. The proximity effect density $U'(x)$ is based on the position of the figure pattern before GMC. This is because the correction calculation of a proximity effect should be calculated based on the position on the surface of the target object, and if calculated based on the position after the GMC, since it is shifted from the design position, an error will occur in correction of the proximity effect. Thus, the correction irradiation coefficient term $d1'$ of the first order term for the correction irradiation coefficient $D_p'(x)$ (second proximity effect correction irradiation coefficient) is calculated using the area density $\rho'(x)$ obtained from pattern data before GMC of the writing data. That is, the area density $\rho(x)$ obtained from pattern data before GMC is used.

The contents of the $D_p''(x)$ calculation step (S118) are the same as those of the first embodiment. In the third embodiment, similarly to the first embodiment, calculated is only the correction irradiation coefficient term $d1'$ of the first order term which is affected most by modulation of the dose to improve the resolution of a small-sized pattern, and then, the correction irradiation coefficient term $d_1$ of the first order term of the correction irradiation coefficient $D_p(x)$ which has already been calculated is replaced by the calculated correction irradiation coefficient term $d1'$ of the first order term, thereby greatly reducing the calculation time. Moreover, since the correction irradiation coefficient $D_p''(x)$ which has been obtained by this replacement includes the correction irradiation coefficient term $d1'$ of the first order term which is affected most by modulation of the dose to improve the resolution of a small-sized pattern, it is possible to perform proximity effect correction taking account of the influence of modulation of the dose to improve the resolution of a small-sized pattern.

As described above, the correction irradiation coefficient term calculated for the correction irradiation coefficient $D_p'(x)$ is not limited to the first order term. In the case of calculating the correction irradiation coefficient term of the second or subsequent order term, in the correction irradiation coefficient terms of from the first order term to the n-th order term for the correction irradiation coefficient $D_p(x)$ (first proximity effect correction irradiation coefficient), the correction irradiation coefficient term of a certain order term should be replaced by the correction irradiation coefficient term of the correction irradiation coefficient $D_p'(x)$ whose order term is the same as the certain order term. Although the calculation time becomes longer than that of the case where the correction irradiation coefficient term of the first order term is replaced, the correction residual error of proximity effect correction can be reduced.

In the $D'(x)$ calculation step (S121), the $D'$ calculation unit 84 calculates, for each shot figure for which GMC has been performed, a dose by using the correction irradiation coefficient $D_p''(x)$ (third proximity effect correction irradiation coefficient). Specifically, a dose $D'(x)$ is calculated by multiplying the obtained correction irradiation coefficient $D_p''(x)$ by a reference dose $D_0$ and $1/(2\alpha'(x))$.

In the $t'(x)$ calculation step (S122), the $t'$ calculation unit 85 calculates, for each shot figure, an irradiation time $t'(x)$. The irradiation time $t'(x)$ can be obtained by dividing the dose $D'(x)$ by the current density J. The obtained irradiation time $t'(x)$ is additionally defined in the shot data, for each shot figure.

In the writing step (S124), the writing control unit 86 controls the writing mechanism 150 through deflection control circuit 120, etc., and starts writing processing. The writing mechanism 150 writes a pattern on the target object 101, using the electron beam 200, based on the calculated dose $D'(x)$ (irradiation time $t'(x)$). Specifically, it operates as described below. The deflection control circuit 120 acquires an irradiation time from the shot data stored in the storage device 142. Then, the deflection control circuit 120 outputs a digital signal which controls the irradiation time of each shot to the DAC amplifier unit 130. The DAC amplifier unit 130 converts the digital signal to an analog signal and amplifies it to be applied as a deflection voltage to the blanking deflector 212.

With respect to the electron beam 200 emitted from the electron gun 201 (emitter), when passing through the blanking deflector 212, it is controlled to pass through the blanking aperture plate 214 by the blanking deflector 212 when in the beam ON state, and the whole of it is deflected to be blocked by the blanking aperture plate 214 when in the beam OFF state. The electron beam 200 that has passed through the blanking aperture plate 214 during the period from the time of changing from a beam OFF state to a beam ON state to the time of again changing to a beam OFF state serves as one shot of the electron beam. The blanking deflector 212 controls the direction of the passing electron beam 200 to alternately generate a beam ON state and a beam OFF state. For example, when in a beam ON state, no voltage is applied to the blanking deflector 212, and, when in a beam OFF state, a voltage should be applied to it. The dose per shot of the electron beam 200 to irradiate the target object 101 is adjusted depending upon an irradiation time of each shot.

As described above, each shot of the electron beam 200, generated by passing through the blanking deflector 212 and the blanking aperture plate 214, irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which moves continuously. As described above, a plurality of shots of the electron beam 200 are deflected in order, by each deflector, onto the target object 101 serving as a substrate.

Figure 11:
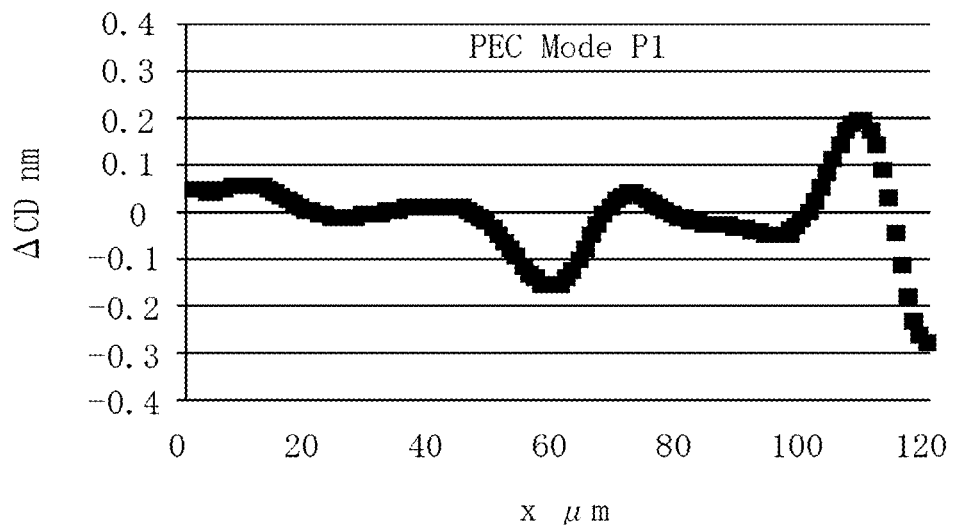
FIG. 11 shows an example of the result of dimensional deviation in the case of writing an evaluation pattern under the conditions of a comparative example of the third embodiment.
Figure 12:
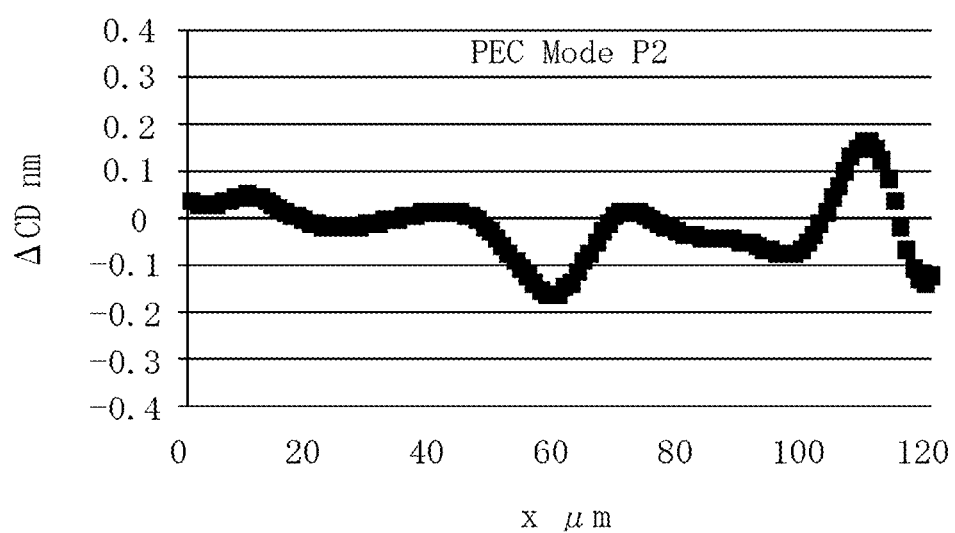
FIG. 12 shows an example of the result of dimensional deviation in the case of writing an evaluation pattern under the conditions according to the third embodiment.

FIG. 11 shows an example of the result of dimensional deviation in the case of writing an evaluation pattern under the conditions of the comparative example of the third embodiment. FIG. 12 shows an example of the result of dimensional deviation in the case of writing an evaluation pattern under the conditions according to the third embodiment. In FIGS. 11 and 12, the ordinate axis denotes a dimensional deviation amount $\Delta CD$ and the abscissa axis denotes the position x of an evaluation pattern.

In the comparative example of the third embodiment, with respect to the equation (10) described above, the correction irradiation coefficient $D_p'(x)$ is calculated by performing repetition calculation from the first order term to the n-th order term (n is an integer of 1 or more) and adding each correction irradiation coefficient term from the first order term to the n-th order term in order to obtain an unknown correction irradiation coefficient $D_p'(x)$ (PEC mode 1 case). FIG. 11 shows the result of dimensional deviation in the case of writing an evaluation pattern based on the dose calculated by using the correction irradiation coefficient $D_p'(x)$.

By contrast, according to the third embodiment, with respect to the equation (10) described above, the correction irradiation coefficient $D_p''(x)$ is obtained by calculating only the correction irradiation coefficient term of the first order term for calculating an unknown correction irradiation coefficient $D_p'(x)$, and replacing the correction irradiation coefficient term $d_1$ of the first order term of the correction irradiation coefficient $D_p(x)$, which has already been obtained, by the correction irradiation coefficient term $d_1'$ of the first order term (PEC mode 2 case). FIG. 12 shows the result of dimensional deviation in the case of writing an evaluation pattern based on the dose calculated by using the correction irradiation coefficient $D_p''(x)$ of the third embodiment. When comparing FIG. 11 with FIG. 12, since there is no great difference in dimensional deviation amount $\Delta CD$ at each position x, it turns out that correction has been performed successfully.

As described above, according to the third embodiment, it is possible to greatly reduce the operation time so that the correction calculation speed may not be slower than the writing speed. Furthermore, it is possible to efficiently improve the resolution of a small-sized pattern while suppressing correction residual error of proximity effect. Therefore, pattern writing can be performed with high dimension accuracy.

Although GMC (grid matching correction) is performed in the examples described above, it is not limited thereto. The case without performing GMC is acceptable.

In the example described above, when calculating the correction irradiation coefficient term $d_1'$ of the first order term for obtaining the correction irradiation coefficient $D_p'(x)$ taking account of various effects, the proximity effect density U(x) obtained by convolving the area density $\rho$ with the distribution function g is used, but it is not limited thereto. Similarly to the second embodiment, it is also preferable to perform calculation using the area density without convolution.

Figure 13:
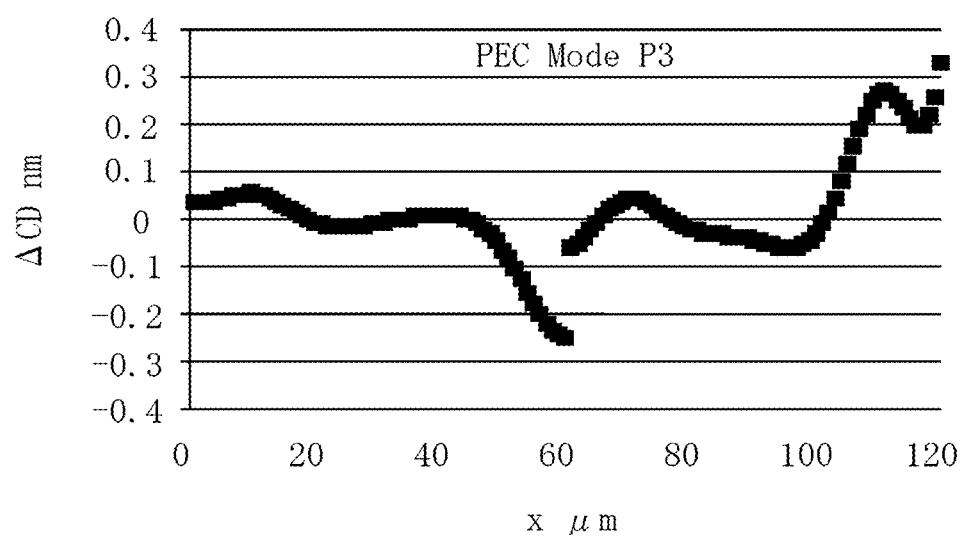
FIG. 13 shows an example of the result of dimensional deviation in the case of writing an evaluation pattern under the conditions according to the third embodiment.

FIG. 13 shows an example of the result of dimensional deviation in the case of writing an evaluation pattern under the conditions according to the third embodiment. The evaluation pattern is the same as that of FIG. 5. In FIG. 13, the ordinate axis denotes a dimensional deviation amount $\Delta CD$ and the abscissa axis denotes the position x of an evaluation pattern. According to the third embodiment, when calculating only the correction irradiation coefficient term $d_1'$ of the first order term for obtaining an unknown correction irradiation coefficient $D_p'(x)$, the area density $\rho(x)$ obtained without convolution is used. The others are the same as those of the second embodiment (PEC mode 2). Then, based on these contents, the correction irradiation coefficient $D_p''(x)$ is obtained (PEC mode 3). FIG. 13 shows the result of dimensional deviation in the case of writing an evaluation pattern based on the dose calculated by using the correction irradiation coefficient $D_p''(x)$ of the third embodiment. When comparing FIG. 13 with FIGS. 11 and 12, the accuracy degrades at the position where a line and space pattern and a solid pattern are connected with each other and the position near the end of the evaluation pattern, but, there is no great difference with respect to the dimensional deviation amount $\Delta CD$ at each position x in the central part of the line and space pattern and central part of the solid pattern. That is, it turns out that correction has been performed successfully.

Moreover, in the third embodiment, although the correction irradiation coefficient term $d_1'$ of the first order term of the correction irradiation coefficient $D_p'(x)$ (second proximity effect correction irradiation coefficient) taking account of various effects is calculated, it is not limited thereto. What is necessary is just to calculate correction irradiation coefficient terms up to the k-th order term of the correction irradiation coefficient $D_p'(x)$ (second proximity effect correction irradiation coefficient) taking account of various effects. k denotes one of integers from 1 to n. As described above in the first embodiment, it is most preferable that k=1, but k is not limited to 1 and may be 2 or more. However, in the case of setting k to be high order of second order or more, calculation up to the k-th order term is needed.

Embodiments have been explained referring to specific examples described above. However, the present invention is not limited to these specific examples. For example, although the first embodiment describes the case of using multi-beams, the contents of the first embodiment can be similarly applied to a writing apparatus employing the raster method and using a single beam. Moreover, although, as various effects, dose modulation due to pattern edge/corner correction and dose modulation for improvement of the resolution of a small-sized pattern are described, they are not limited thereto. For example, there is included dose modulation for correcting an effect resulting from dimensional variation other than proximity effect, such as resist heating correction. Furthermore, although, as a method of calculating a correction irradiation coefficient, the area density of a figure pattern is used, it is not limited thereto. For example, the correction irradiation coefficient may be calculated using a dose density obtained by multiplying the area density by the dose weight.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and method that include elements of the present invention and that can be appropriately modified by those skilled in the art, and acquisition method of a dose modulation coefficient of a charged particle beam are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a first correction-irradiation-coefficient-term calculation processing circuitry configured to calculate correction irradiation coefficient terms of from a first order term to an n-th order term, n being an integer of 1 or more, in a case of calculating a first proximity effect correction irradiation coefficient which does not take account of a predetermined effect in order to correct proximity effect of a charged particle beam;
a second correction-irradiation-coefficient-term calculation processing circuitry configured to calculate at least one correction irradiation coefficient term up to a k-th order term, k being an integer from 1 to n, in a case of calculating a second proximity effect correction irradiation coefficient which takes account of the predetermined effect in order to correct the proximity effect of the charged particle beam;
a proximity-effect-correction-irradiation-coefficient calculation processing circuitry configured to calculate a third proximity effect correction irradiation coefficient, where at least one correction irradiation coefficient term up to the k-th order term, in the correction irradiation coefficient terms of from the first order term to the n-th order term for the first proximity effect correction irradiation coefficient which does not take account of the predetermined effect, are replaced by the at least one correction irradiation coefficient term up to the k-th order term, for the second proximity effect correction irradiation coefficient which takes account of the predetermined effect;
a dose calculation processing circuitry configured to calculate a dose by using the third proximity effect correction irradiation coefficient; and
a writing mechanism including a stage on which a target object is placed, a charged particle beam source, and a deflector, the writing mechanism configured to write a pattern on the target object by using a charged particle beam based on the dose calculated.

2. The apparatus according to claim 1, wherein
the second correction-irradiation-coefficient-term calculation processing circuitry calculates, as the correction irradiation coefficient term, a correction irradiation coefficient term of a first order term in the case of calculating the second proximity effect correction irradiation coefficient, and
the proximity-effect-correction-irradiation-coefficient calculation processing circuitry calculates the third proximity effect correction irradiation coefficient where the correction irradiation coefficient term of the first order term, in the correction irradiation coefficient terms of from the first order term to the n-th order term for the first proximity effect correction irradiation coefficient which does not take account of the predetermined effect, is replaced by the correction irradiation coefficient term of the first order term for the second proximity effect correction irradiation coefficient which takes account of the predetermined effect.

3. The apparatus according to claim 2, wherein the correction irradiation coefficient term of the first order term for the second proximity effect correction irradiation coefficient is calculated using a convolution value between an area density and a distribution function.

4. The apparatus according to claim 2, wherein the correction irradiation coefficient term of the first order term for the second proximity effect correction irradiation coefficient is calculated using an area density without convolution.

5. The apparatus according to claim 1, wherein
the writing mechanism includes a mirror arranged on the stage, for measuring a position of the stage,
the apparatus further comprising:
a storage device configured to store writing data defining pattern data of a plurality of patterns; and
a position deviation correction processing circuitry configured to correct the pattern data, based on position deviation of a pattern to be written caused by distortion of at least one of the target object and the mirror, wherein
the correction irradiation coefficient terms up to the k-th order term for the second proximity effect correction irradiation coefficient are calculated using an area density obtained from the pattern data before being corrected, and
the dose is calculated using an area density obtained from the pattern data after being corrected.

6. The apparatus according to claim 1, further comprising:
a temporary dose calculation processing circuitry configured to calculate a temporary dose by using the first proximity effect correction irradiation coefficient; and
an influence coefficient calculation processing circuitry configured to calculate an influence coefficient at a position affected by the predetermined effect by using the temporary dose,
wherein the second correction-irradiation-coefficient-term calculation processing circuitry calculates the correction irradiation coefficient terms up to the k-th order term by using the influence coefficient and the correction irradiation coefficient terms up to the k-th order term takes account of the predetermined effect.

7. The apparatus according to claim 6, wherein the influence coefficient depends on the position affected by the predetermined effect and on the temporary dose at the position affected by the predetermined effect.

8. The apparatus according to claim 7, wherein
the writing mechanism includes a mirror arranged on the stage, for measuring a position of the stage,
the apparatus further comprising:
a storage device configured to store writing data defining pattern data of a plurality of patterns; and
a position deviation correction processing circuitry configured to correct the pattern data, based on position deviation of a pattern to be written caused by distortion of at least one of the target object and the mirror, wherein
the influence coefficient calculation processing circuitry calculates, based on the temporary dose at a first position of the pattern data after being corrected, the influence coefficient at the first position, and shifts the influence coefficient calculated at the first position to an influence coefficient at a second position, corresponding to the first position, of the pattern data before being corrected, and
the second correction-irradiation-coefficient-term calculation processing circuitry calculates, based on the influence coefficient having been shifted, the correction irradiation coefficient terms up to the k-th order term.

9. A charged particle beam writing method comprising:
calculating correction irradiation coefficient terms of from a first order term to an n-th order term, n being an integer of 1 or more, in a case of calculating a first proximity effect correction irradiation coefficient which does not take account of a predetermined effect in order to correct proximity effect of a charged particle beam;

calculating at least one correction irradiation coefficient term up to a k-th order term, k being an integer from 1 to n, in a case of calculating a second proximity effect correction irradiation coefficient which takes account of the predetermined effect in order to correct the proximity effect of the charged particle beam;

calculating a third proximity effect correction irradiation coefficient where at least one correction irradiation coefficient term up to the k-th order term, in the correction irradiation coefficient terms of from the first order term to the n-th order term for the first proximity effect correction irradiation coefficient which does not take account of the predetermined effect, are replaced by the at least one correction irradiation coefficient term up to the k-th order term, for the second proximity effect correction irradiation coefficient which takes account of the predetermined effect;

calculating a dose by using the third proximity effect correction irradiation coefficient; and writing a pattern on a target object by using a charged particle beam based on the dose calculated.

10. The method according to claim 9, wherein a correction irradiation coefficient term of a first order term is calculated as the correction irradiation coefficient term in the case of calculating the second proximity effect correction irradiation coefficient, and the third proximity effect correction irradiation coefficient is calculated where the correction irradiation coefficient term of the first order term, in the correction irradiation coefficient terms of from the first order term to the n-th order term for the first proximity effect correction irradiation coefficient which does not take account of the predetermined effect, is replaced by the correction irradiation coefficient term of the first order term for the second proximity effect correction irradiation coefficient which takes account of the predetermined effect.

* * * * *